United States Patent [19]

Minomiya et al.

[11] Patent Number: 5,654,111
[45] Date of Patent: Aug. 5, 1997

[54] ELECTRONIC DEVICE HAVING A BATTERY AND A BATTERY THEREFOR

[75] Inventors: Takeo Minomiya, Kanagawa; Naoki Kamaya, Tokyo; Katsutoshi Amano, Kanagawa; Katsuji Ashida; Hiroshi Kagawa, both of Osaka, all of Japan

[73] Assignees: Sony Corporation; Yuasa Corporation, both of, Japan

[21] Appl. No.: 490,032

[22] Filed: Jun. 13, 1995

[30] Foreign Application Priority Data

Jun. 28, 1994 [JP] Japan .................................. 6-146736
Jun. 28, 1994 [JP] Japan .................................. 6-146737
Jun. 28, 1994 [JP] Japan .................................. 6-146738

[51] Int. Cl.$^6$ .......................... H01M 2/30; H01M 6/18; H01M 6/40; H01M 6/46
[52] U.S. Cl. ........................... 429/162; 429/127
[58] Field of Search .................. 429/121, 123, 429/127, 162, 163, 192

[56] References Cited

U.S. PATENT DOCUMENTS

| | | | |
|---|---|---|---|
| 4,703,754 | 11/1987 | Ibbott | 128/383 |
| 4,749,875 | 6/1988 | Hara | 307/150 |
| 5,019,468 | 5/1991 | Takeshi . | |
| 5,073,684 | 12/1991 | Miyabayashi | 174/260 |
| 5,180,645 | 1/1993 | Moré | 429/127 |
| 5,338,625 | 8/1994 | Bates et al. | 429/193 |
| 5,455,126 | 10/1995 | Bates et al. | 429/217 |
| 5,486,680 | 1/1996 | Lieberman | 219/211 |

FOREIGN PATENT DOCUMENTS

| | | |
|---|---|---|
| 62-271343 | 5/1988 | Japan . |
| 2270793 | 3/1994 | United Kingdom . |
| WO9103921 | 3/1991 | WIPO . |
| WO9314612 | 7/1993 | WIPO . |

*Primary Examiner*—M. Nuzzolillo
*Attorney, Agent, or Firm*—Ronald P. Kananen

[57] ABSTRACT

An electronic device having a flat and thin battery connected thereto by bonding or soldering, wherein the battery and the electronic equipment are connected electrically.

31 Claims, 43 Drawing Sheets

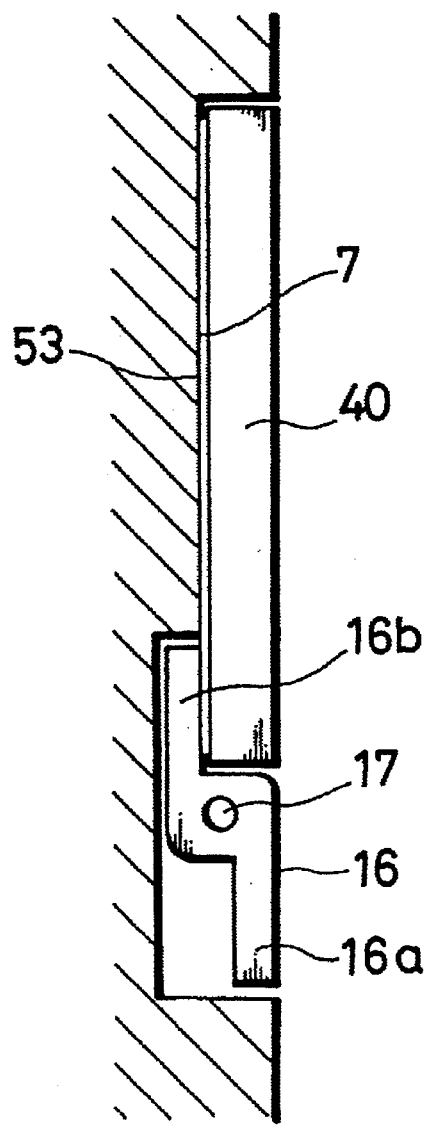
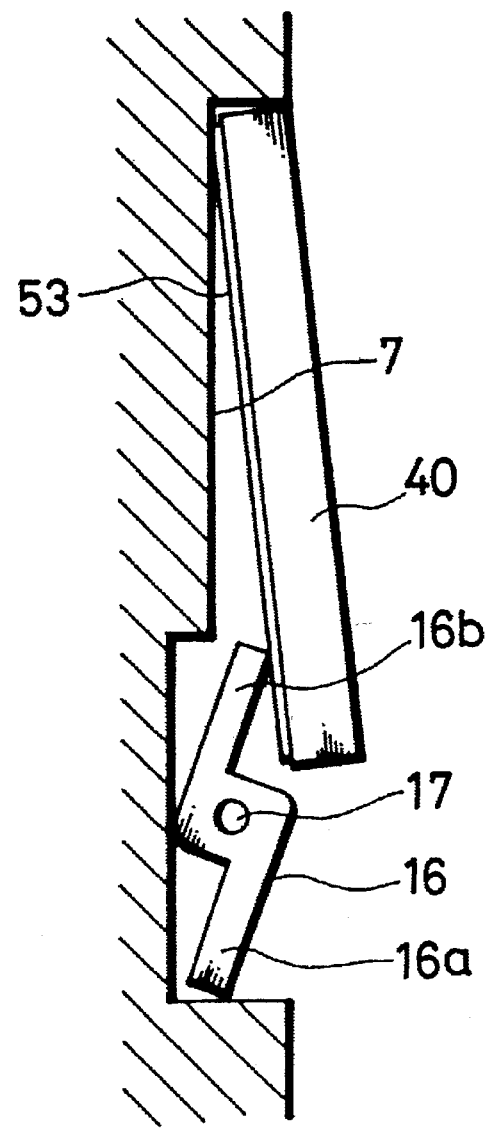

F I G. 15
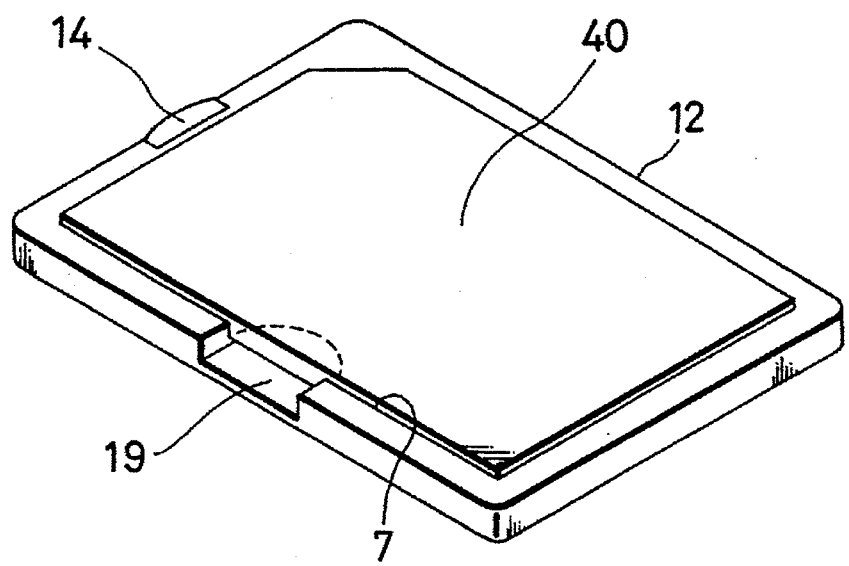
F I G. 16
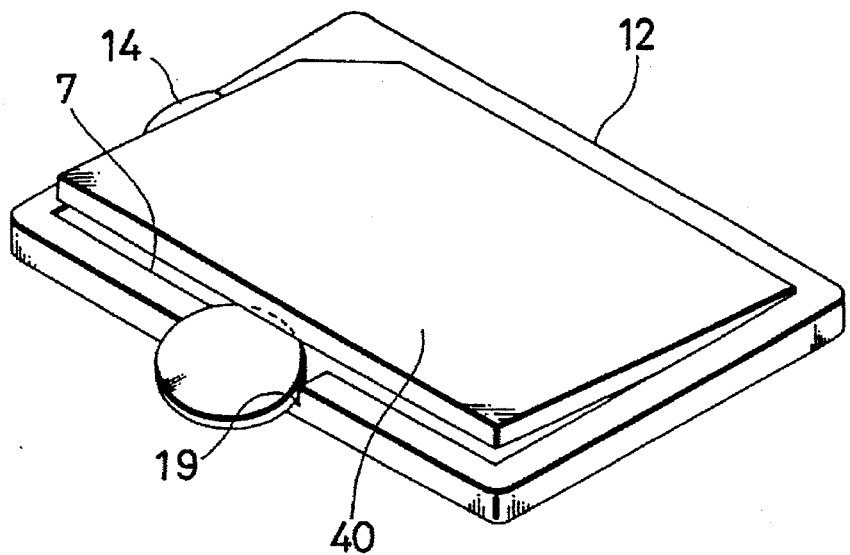

F I G. 51
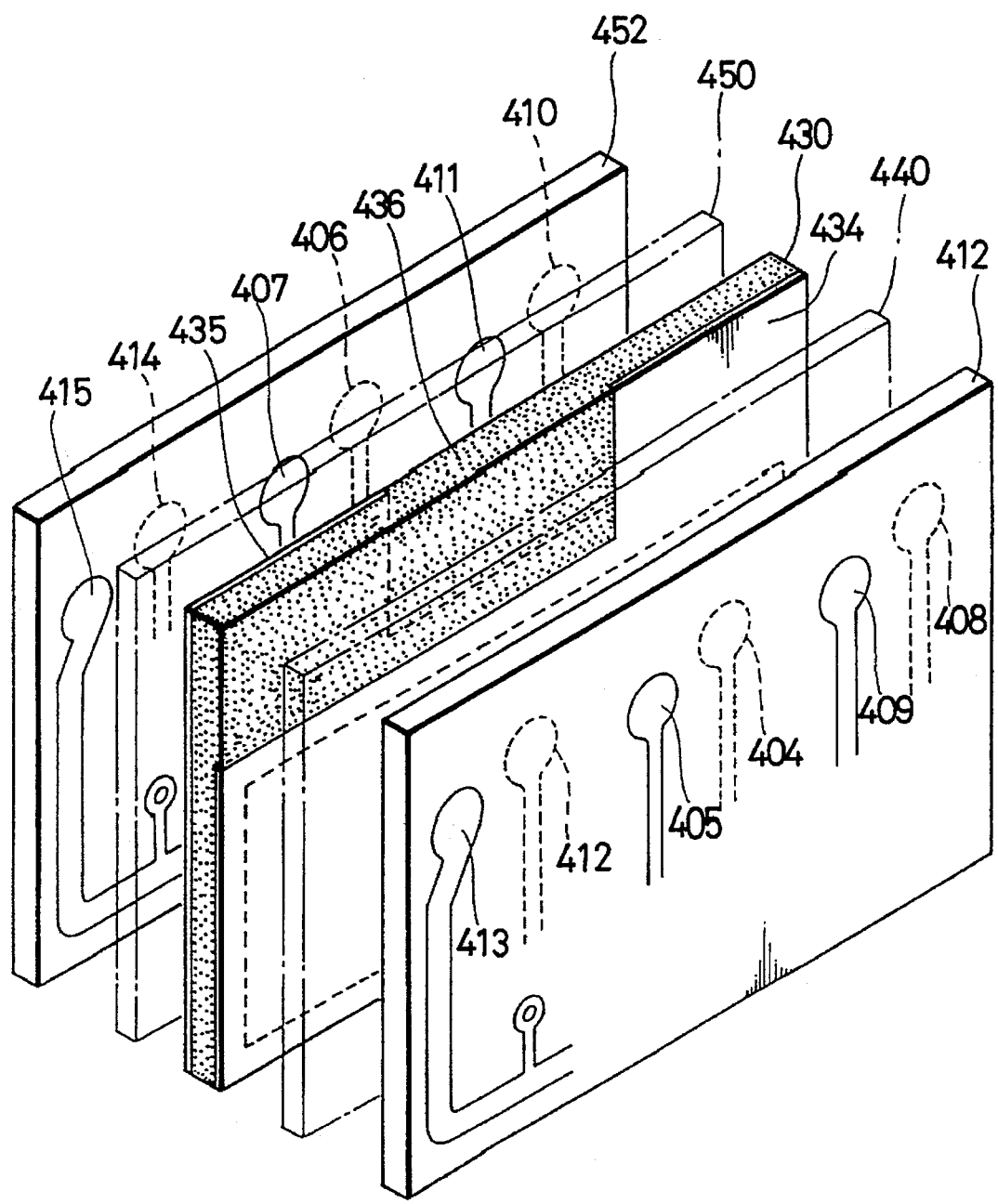

ELECTRONIC DEVICE HAVING A BATTERY AND A BATTERY THEREFOR

BACKGROUND OF THE INVENTION

The present invention relates to an attachment structure for attaching a flat and thin battery (referred to hereinafter as a "film-shaped battery") to electronic devices.

A wide variety of electronic devices can be attached with a battery. Further, electronic devices include therein a primary cell, a secondary cell, a capacitor with a large capacity and so on in order to back up a memory used therein. The primary cell, the secondary cell and the capacitor with the large capacity are able to operate during a relatively short period of time in order to back up a memory of an electronic device when a power failure of a short period of time occurs or an electronic device is deenergized in the shopfront of a shop at night or on a shop holiday.

Examples of such electronic devices will be described below with reference to FIGS. 1 to 3.

FIG. 1 of the accompanying drawings shows a video camera as an example of the electronic device. As shown in FIG. 1, the video camera is composed of a video camera body 1, a viewfinder 2, a liquid crystal display unit 3 for displaying date, time, counter, various modes, operation buttons 4 for switching displayed contents on the liquid crystal display unit 3, an attachment portion 5 to which a drive battery (not shown) is attached and a power supply terminals 6 connected to electrode portions of a drive battery.

The video camera has a battery compartment 7 for accommodating a memory backup battery 30 such as a button battery formed on the surface to which the drive battery is attached. When the battery 30 is fitted into the battery compartment 7, positive and negative electrodes of the battery 30 are respectively connected to power supply terminals 8 and 9 in the battery compartment 7 to back up a memory, such as data and time memory. The battery compartment 7 is closed by a rotating type battery lid 10.

FIG. 2 shows an electronic wristwatch as an example of an electronic device.

As shown in FIG. 2, the wristwatch includes a wristwatch body 11 having on its rear surface formed the battery compartment 7. When the battery 30 is fitted into the battery compartment 7 as its operation power supply source, the positive and negative electrodes of the battery 30 are respectively connected to the power supply terminals 8 and 9 in the battery compartment 7 to energize the wristwatch.

In this wristwatch, the battery compartment 7 is closed by the screw-type battery lid 10. Specifically, under the condition that a screw slit 10a formed on the outer periphery of the battery lid 10 is screwed into a screw slit 7a formed on the inner periphery of the battery compartment 7, when the battery lid 10 is turned, the battery compartment 7 is closed in a water-proof fashion.

FIGS. 3A and 3B show a so-called card-type remote controller as an example of electronic devices. FIG. 3A is a front perspective view of such remote controller and FIG. 3B is a rear perspective view thereof.

As illustrated in FIGS. 3A and 3B, this remote controller includes a remote controller body 12, an operation button pad 13 having a plurality of operation buttons thereon, an infrared ray emitting unit 14 and a battery holder 15. When the battery 30 is set on the battery holder 15 as an operation power supply and the battery holder 15 is fitted into the battery compartment 7, the positive and negative electrodes of the battery 30 are respectively connected to the power supply terminals 8, 9 in the remote controller body 12 to energize the remote controller.

The above electronic devices suffered from the following problems.

The video camera shown in FIG. 1 needs the battery lid 10 to close the battery compartment 7. Therefore, if the battery lid 10 were broken, the battery 30 would be dropped out from the battery compartment 7 easily. Thus, the video camera becomes useless in actual practice.

The wristwatch shown in FIG. 2 also needs the battery lid 10 to close the battery compartment 7. If the battery 30 is exchanged, the user has to turn the battery lid 10 and to remove the same. After the battery 30 was exchanged, the user has to turn the battery lid 10 to attach the same to the battery compartment 7. This work becomes very cumbersome for the user. Moreover, if the battery lid 10 were lost, the battery 30 would be dropped from the battery compartment 7 easily. Thus, the wristwatch becomes useless in actual practice.

The remote controller shown in FIGS. 3A and 3B is not of the type that the battery 30 is directly loaded onto the battery compartment 7 but is of the type that the battery holder 15 is fitted into the battery compartment 7 after the battery 30 was set on the battery holder 15. This work becomes very cumbersome for the user. Further, the battery holder 15 makes the remote controller become complicated in arrangement and also increases the thickness of the remote controller body 12. Therefore, the battery holder 15 hinders the remote controller from being reduced in thickness.

Furthermore, this remote controller is deteriorated in water-proof or the like because water enters the battery compartment 7 from a clearance between the remote controller body 12 and the battery holder 15.

OBJECTS AND SUMMARY OF THE INVENTION

In view of the aforesaid aspect, it is an object of the present invention to provide a flat and thin battery in which the above-mentioned problems can be solved.

According to an aspect of the present invention, there is provided an electronic device having a flat and thin battery connected thereto by bonding or soldering, wherein the battery and the electronic equipment are connected electrically.

According to another aspect of the present invention, there is provided a battery bonded to an electronic device which is comprised of a film-shaped battery, an electrode formed on one surface of the film-shaped battery, and an adhesive layer formed on one surface of the film-shaped battery, wherein the battery is electrically connected to the electronic device by connecting its electrode to a terminal of the electronic device under the condition that the film-shaped battery is bonded to the electronic device by the adhesive layer.

According to the present invention, the film-shaped battery can be attached to the electronic device with ease by bonding. Since the film-shaped battery can be attached to the electronic device by bonding, the battery lid becomes unnecessary unlike the conventional battery. Therefore, the film-shaped battery can be prevented from becoming useless unlike the conventional battery which frequently becomes useless when the battery lid thereof is broken or lost. Further, since the film-shaped battery is extremely thin, even when the film-shaped battery is attached to the electronic equipment, the thickness of the electronic device can be avoided from being increased substantially. Furthermore, since the film-shaped battery has the adhesive surface which fully surrounds the electrode, under the condition that the film-shaped battery is attached to the electronic device, it is possible to prevent the electrode and so on from being smudged by water and dust.

According to the present invention, since the electrode of the battery is made of metal, it is possible to effectively shield undesired radiation generated from the electronic circuit. Further, since the battery forms a part of the shield case, the battery can be assembled into the narrow space of the electronic device without increasing the thickness of the shield case with an improved space factor. Furthermore, since the battery holder and the battery contacts can be removed unlike the conventional battery, the number of assemblies and the number of manufacturing processes can be reduced.

Furthermore, the battery can efficiently be assembled into the narrow space of the electronic device without increasing the thickness of the printed circuit board substantially.

BRIEF DESCRIPTION OF THE DRAWINGS

FIG. 7A is a side view used to explain an operation of the battery detachable lever and showing the state that the film-shaped battery is attached to the battery attachment portion;

FIG. 7B is a side view used to explain an operation of the battery detachable lever and showing the state that the film-shaped battery is detached from the battery attachment portion by the battery detachable lever;

FIG. 15 is a perspective view showing the state that the film-shaped battery is attached to the battery attaching portion of the remote controller shown in FIG. 12;

FIG. 16 is a perspective view used to explain how to detach the film-shaped battery from the remote controller;

FIGS. 51 and 52 are perspective views used to explain a manufacturing process of the printed circuit board shown in FIG. 50.

DETAILED DESCRIPTION OF THE PREFERRED EMBODIMENTS

Figure 1:
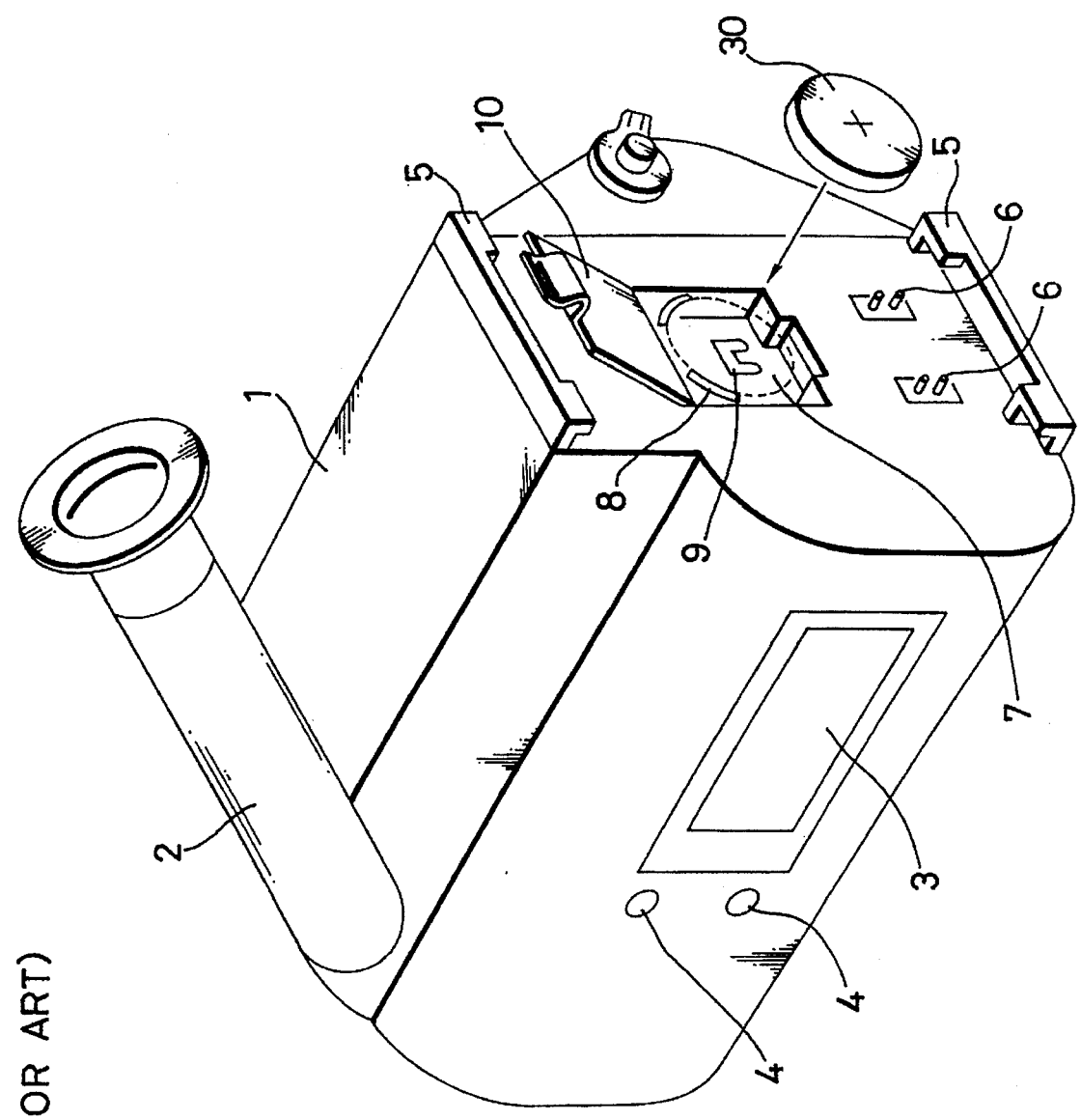
FIG. 1 is a perspective view showing a video camera as an example of electronic devices and seen from its rear side.
Figure 2:
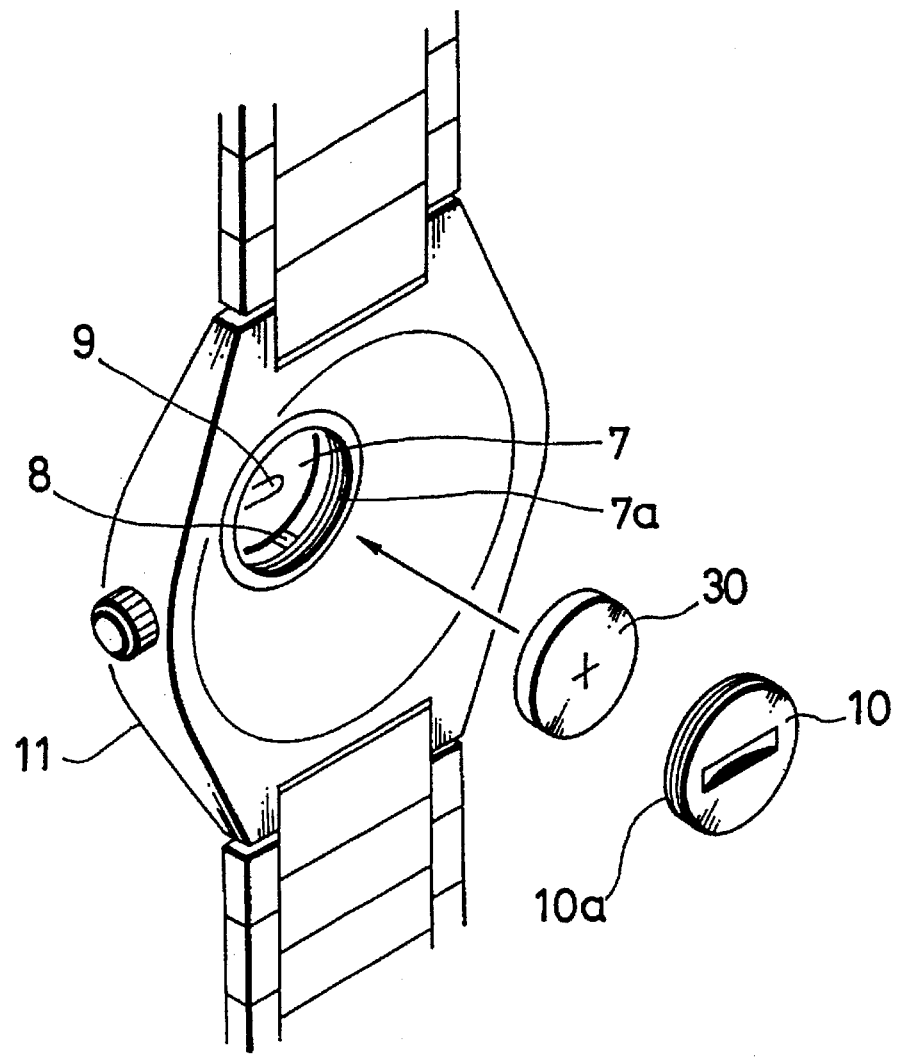
FIG. 2 is a rear perspective view showing an electronic wristwatch as an example of electronic devices.
Figure 3A:
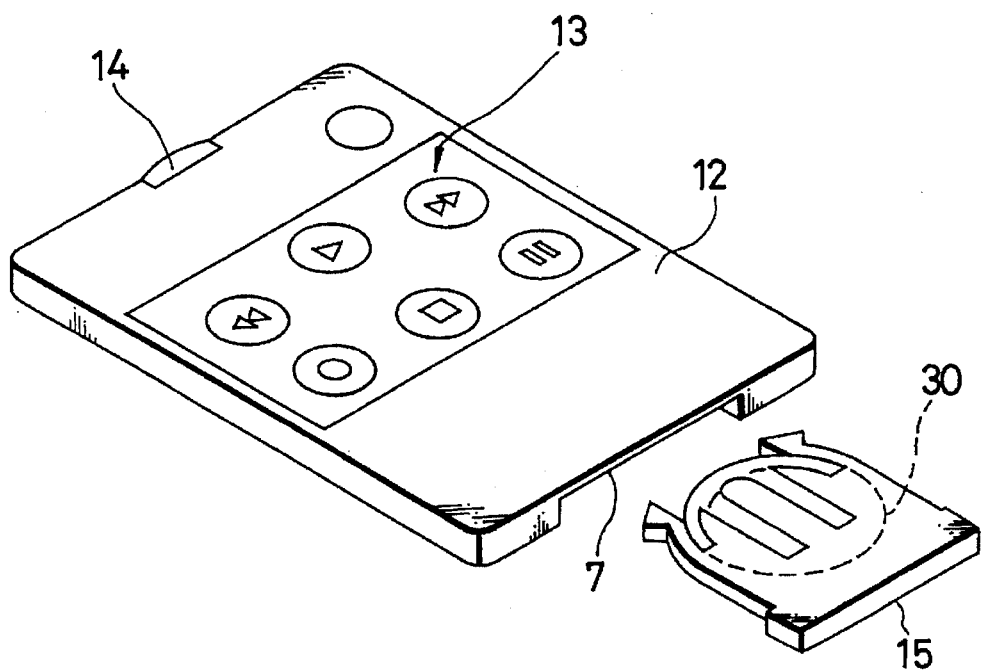
FIG. 3A is a perspective view showing a card-type remote controller as an example of electronic devices.
Figure 3B:
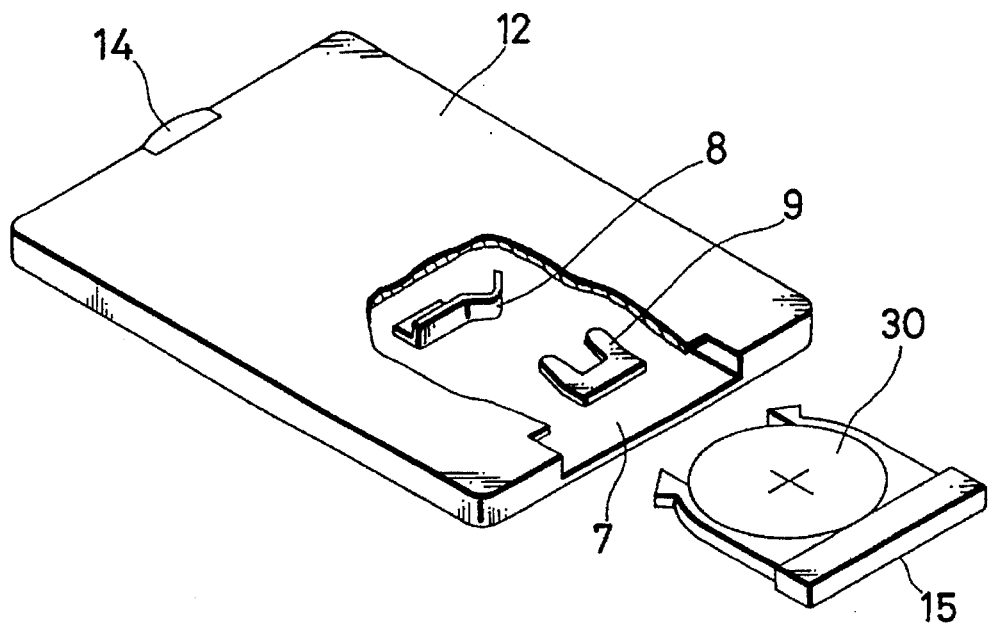
FIG. 3B is a rear perspective view thereof.
Figure 4:
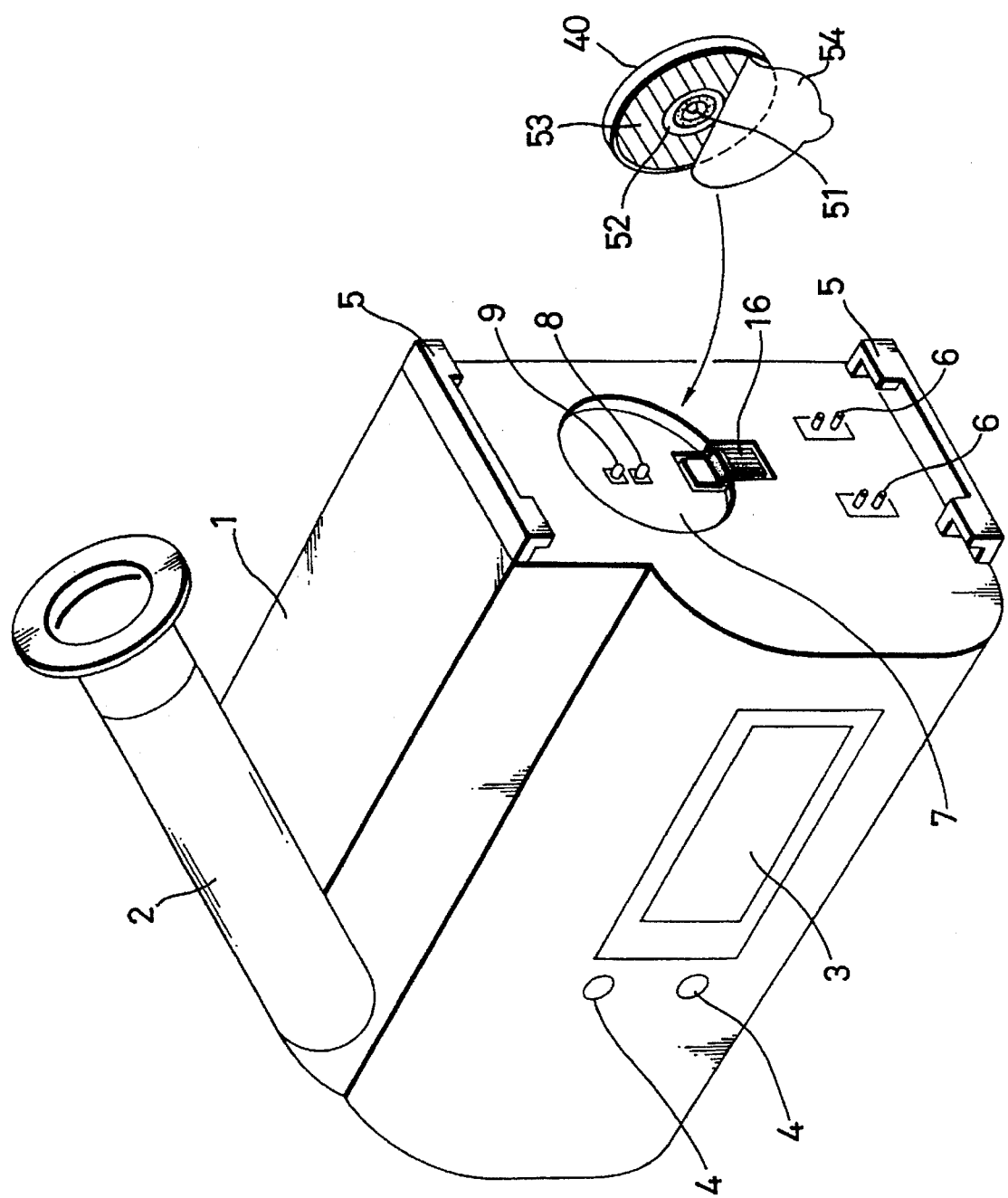
FIG. 4 is a perspective view showing a video camera using a film-shaped battery according to a first embodiment of the present invention and seen from the rear side of the video camera.

The present invention will now be described with reference to FIG. 4 and the following drawings. In FIG. 4 and the following drawings, like element and parts corresponding to those of FIGS. 1 to 3 are marked with the same references.

FIGS. 4 to 10 show a battery according to a first embodiment of the present invention, in particular, an a film-shaped battery for a video camera.

In this embodiment, a film-shaped battery 40 is used as a battery for backing up a memory of a video camera. The film-shaped battery 40 is bonded to the battery compartment portion 7 of the video camera body 1.

The film-shaped battery 40 is a thin and high performance battery with a high energy density. A structure of the film-shaped battery 40 will be described in detail with reference to FIGS. 8 to 10.

Figure 9:
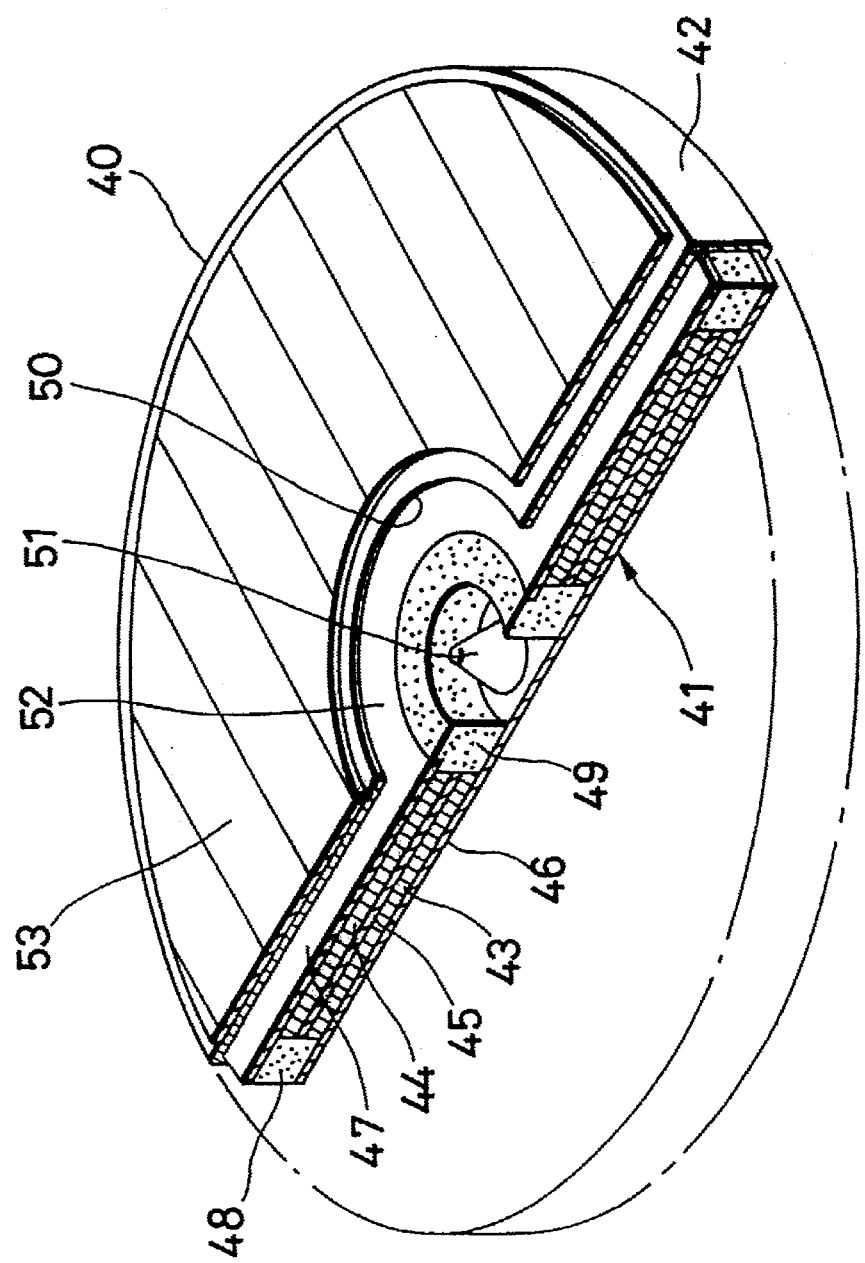
FIG. 9 is a perspective view showing the film-shaped battery under the condition that a half of the film-shaped battery is cut away.
Figure 10:
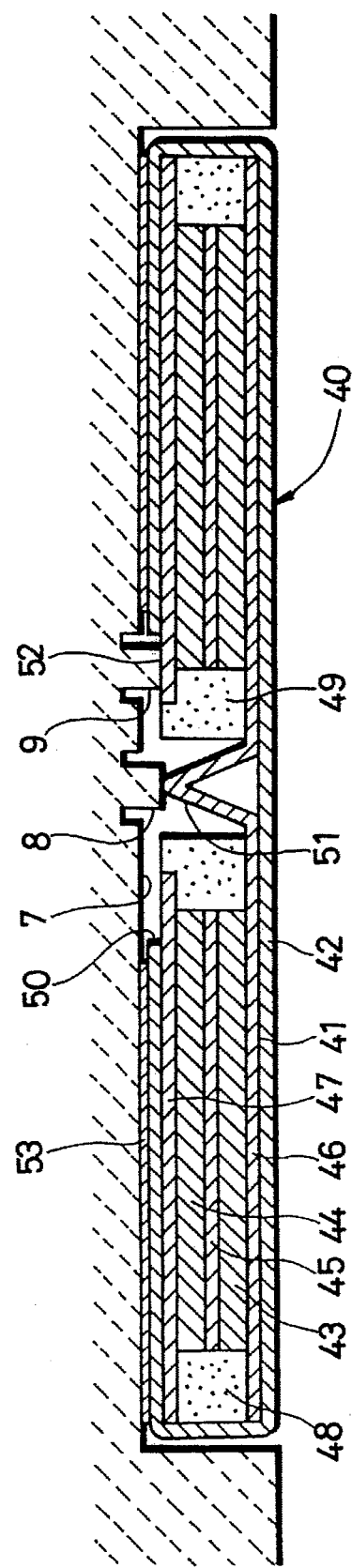
FIG. 10 is a longitudinal cross-sectional view of the film-shaped battery.

As illustrated, the inventive film-shaped battery 40 is composed of a battery body 41 and an insulating outer sheathing member 42 for sheathing the battery body 41. The film-shaped battery 40 is shaped in a disc having its outer diameter of about 2.5 cm. As shown in FIGS. 9 and 10, the battery body 41 housed in the insulating outer sheathing member 42 comprises a positive electrode (manganese dioxide, etc.) 43, a negative electrode (lithium, etc.) 44, a solid polyelectrolyte 45 disposed between the positive and negative electrodes 43 and 44, positive-polarity and negative-polarity current collecting members 46 and 47, each being made of a metal plate (boil), and located on the face surfaces of electrodes 43 and 44 and a shielding member 48 for hermetically shielding the positive-polarity and negative-polarity current collecting members 46 and 47.

The battery body 41 has provided with a hollow central portion within which the positive-polarity current collecting member 46 is retained. This central hollow portion of the battery body 41 is shielded by a shield member 49.

The insulating outer sheathing member 42 has a hole 50 defined at the center thereof so as to expose a part of the negative-polarity current collecting member 47 of the battery body 41. The negative-polarity current collecting member 47 that is exposed from the hole 50 is served as a negative-polarity electrode portion 52.

Figure 8A:
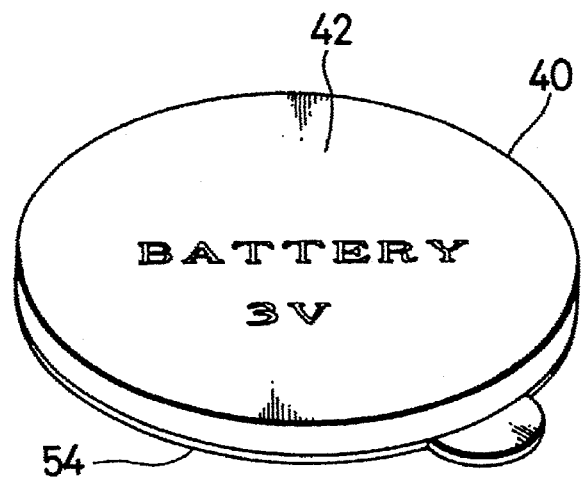
FIG. 8A is a perspective view showing the inventive film-shaped battery seen from its upper surface side.

As shown in FIGS. 9 and 10, a part of the positive-polarity current collecting member 46 exposed from the inner peripheral hole of the shielding member 49 at the central portion of the battery body 41 is projected as a cone. This projected portion is served as a positive-polarity electrode portion 51. Characters indicating a voltage or the like are printed on the surface of the insulating outer sheathing member 42 as shown in FIG. 8A.

As Shown in, for example, PIG. 8B, in the film-shaped battery 40, on the insulating outer sheathing member 42 at its surface in which the electrode portions 51 and 52 are exposed, there is formed or bonded an adhesive seal (similar to a so-called double-sided adhesive tape) 53 so as to surround the periphery of electrode portions 51 and 52 without discontinuity. The film-shaped battery 40 is bonded to the battery attachment portion 7 of the video camera body 1 shown in FIG. 4 by the adhesive seal 53.

Figure 8B:
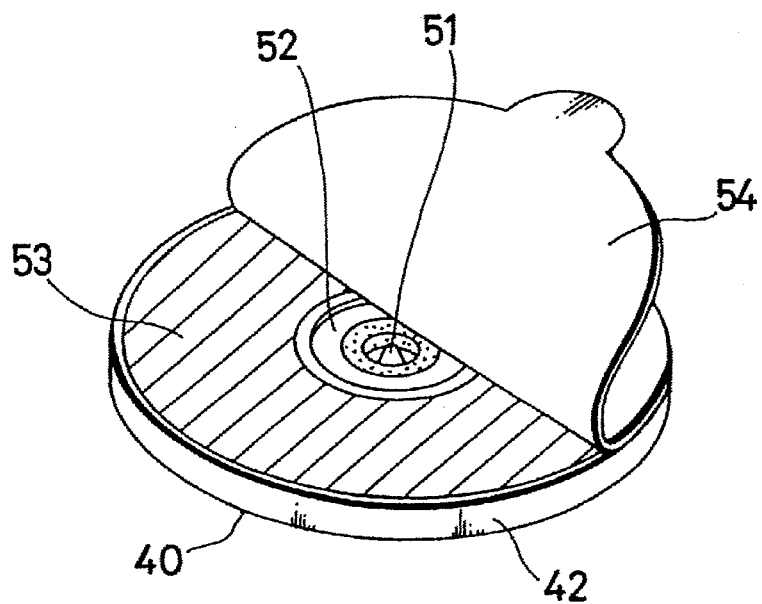
FIG. 8B is a perspective view showing the inventive film-shaped battery seen from its rear surface side.

Before the film-shaped battery 40 is put in use, the bonding surface of the adhesive seal 53 and the electrode portions 51, 52 thereof are covered with a protecting paper 54 as shown in FIG. 8B. When the film-shaped battery 40 is in use, the protecting paper 54 is peeled off and then the film-shaped battery 40 is bonded to the battery attachment portion 7.

While the film-shaped battery 40 is as thin as 0.2 to 0.5 mm in thickness, the film-shaped battery 40 has an exaggerated thickness in order to understand more clearly the structure of the film battery 40 (this is also true in the following embodiments).

On the other hand, the battery attachment portion 7 of the video camera body 1 to which the film-shaped battery 40 is bonded has a circular concave portion corresponding to the outer form of the film-shaped battery 40 in order to attach the film-shaped battery 40 thereto as shown in FIG. 4. The adhesive seal 53 of the film-shaped battery 40 is bonded to the flat surface of the bottom portion of the circular concave portion.

Figure 5:
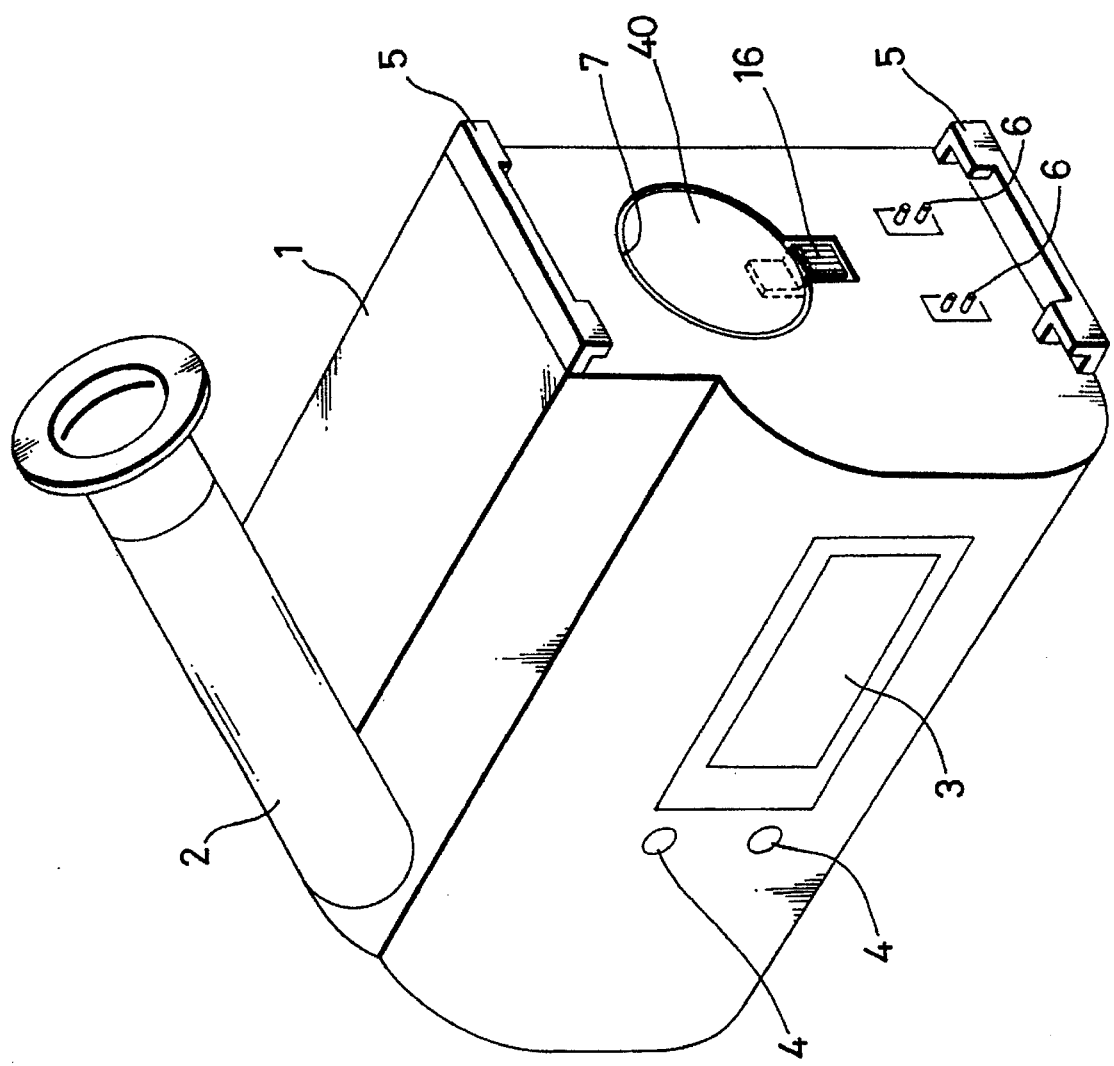
FIG. 5 is a perspective view showing the state that the inventive film-shaped battery is attached to a battery attachment portion of the video camera.

The battery attachment portion 7 has a depth substantially equal to the thickness of the film-shaped battery 40 so that, when the film-shaped battery 40 is attached to the battery attachment portion 7, the outer surface of the film-shaped battery 40 becomes flush with that of the video camera body 1 as shown in FIG. 5.

As shown in FIG. 4, the pin-shaped power supply terminals 8, 9 are projected from the inside of the video camera body 1 at the central portion of the battery attachment portion 7. Under the condition that the film-shaped battery 40 is bonded to the battery attachment portion 7, the positive and negative electrode portions 51, 52 of the film-shaped battery 40 are respectively connected to the power supply terminals 8, 9 to back up the memory housed in the video camera body 1.

Figure 6:
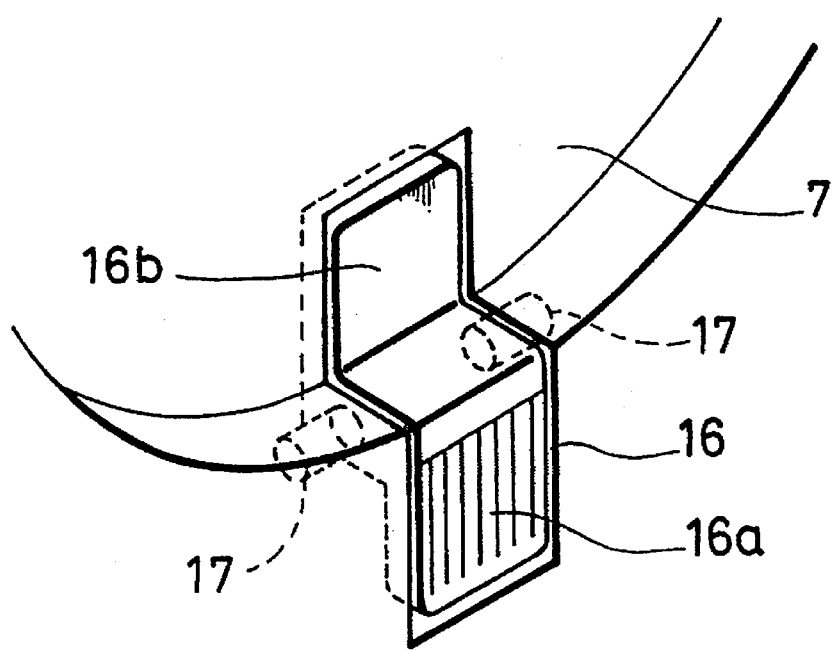
FIG. 6 is a perspective view showing a battery detachable lever in the battery attachment portion in an enlarged scale.

As shown in FIG. 6 and FIGS. 7A, 7B, a battery detachable lever 16 is composed of one operation portion 16a and the other operation portion 16b. The battery detachable lever 16 is pivoted to the cabinet of the video camera body 1 by a shaft portion 17 so as to become rotatable about the shaft portion 17. When one end of the operation portion 16a of the lever 16 is pushed, as shown in FIG. 7B, the other operation portion 16b pushes the film-shaped battery 40 to the outside of video camera body 1, thereby the film-shaped battery 40 being detached from the battery attachment portion 7.

As described above, according to the film-shaped battery 40 for the video camera, when the film-shaped battery 40 is in use, the film-shaped battery 40 can be bonded to the battery attachment portion 7 of the video camera body 1 with ease. When the film-shaped battery 40 is detached from the battery attachment portion 7, the film-shaped battery 40 can be easily detached from the battery attachment portion 7 by pushing the detachable lever 16 at its operation portion 16a. Thus, the film-shaped battery 40 can be exchanged with ease.

Since the film-shaped battery 40 is bonded to the battery attachment portion 7 of video camera body 1 as described above, the battery lid 10 that is required by the video camera shown in FIG. 1 becomes useless. Therefore, the video camera can be prevented from becoming useless even when the battery lid is broken.

Further, since only the power supply terminals 8, 9 are exposed on the battery attachment portion 7, the inside of the video camera body 1 can be protected from being exposed to the outside when the battery is exchanged.

Furthermore, under the condition that the film-shaped battery 40 is attached to the battery attachment portion 7, the power supply terminals 8, 9 and the electrode portions 51, 52 are hermetically shielded by the adhesive seal 53 with no clearance. Thus, the power supply terminals 8, 9 and the electrode portions 51, 52 can be reliably protected from being smudged by water and dust.

Figure 11:
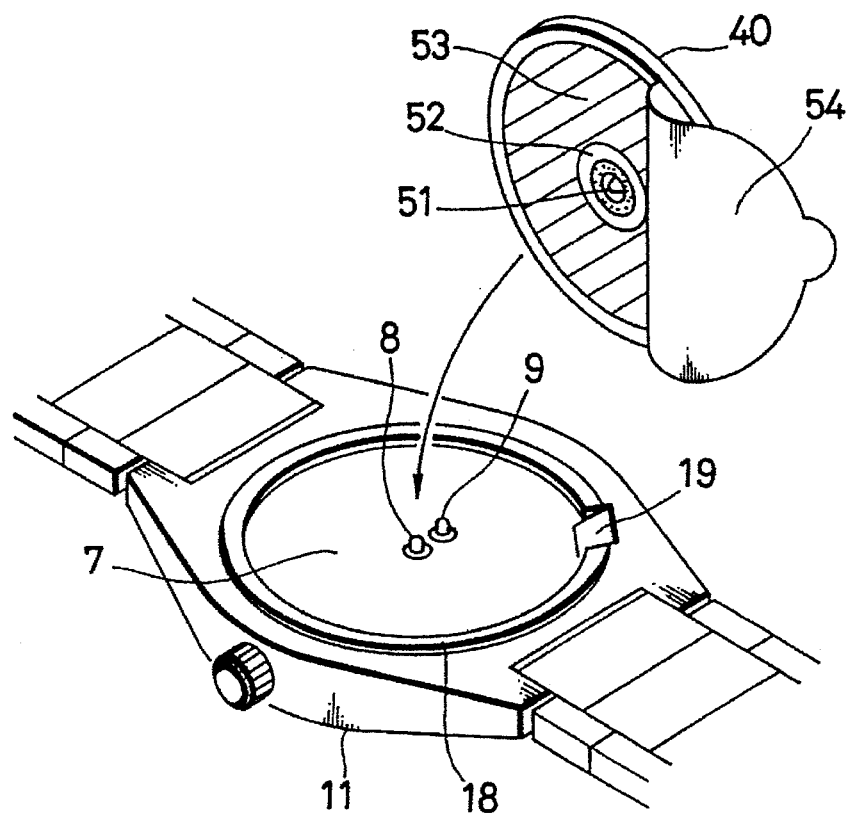
FIG. 11 is a perspective view showing an electronic wristwatch using an inventive battery rear from the rear surface side of the wristwatch.
Figure 12:
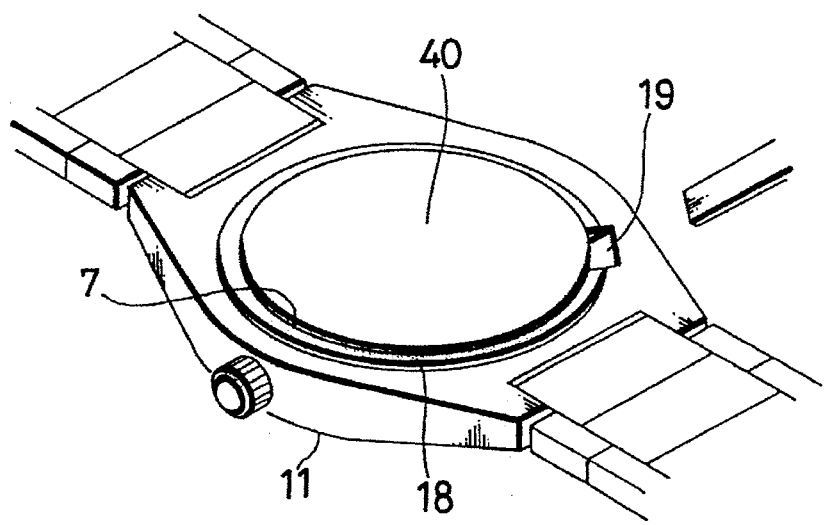
FIG. 12 is a perspective view showing the state that the film-shaped battery is attached to a battery attaching portion of the wristwatch.
Figure 13:
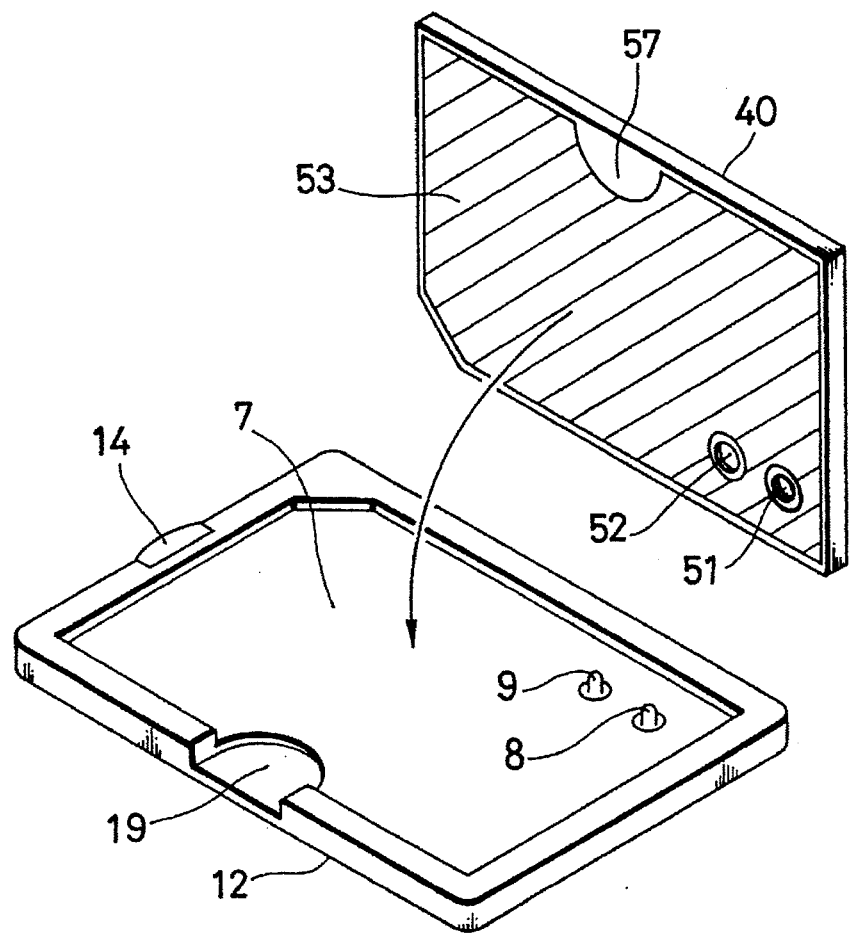
FIG. 13 is a perspective view showing a card-type remote controller using an inventive film-shaped battery seen from the rear surface side of the remote controller.

FIGS. 11 and 12 show a film-shaped battery according to the first embodiment of the present invention. In this embodiment, the film-shaped battery is applied to an electronic wristwatch. In FIGS. 11 and 12, like parts corresponding to those of FIG. 2 are marked with the same references.

When this wristwatch is in use, the film-shaped battery 40 of disk configuration similar to that used in the video camera is attached to the battery attachment portion 7 provided on the rear surface of the wristwatch 11 side. An annular projected edge portion 18 is formed around the battery attachment portion 7 and serves as a guide for bonding the film-shaped battery 40 to the battery attachment portion 7.

When the film-shaped battery 40 is bonded to the battery attachment portion 7 of the wristwatch 11, as shown in FIG. 12, the film-shaped battery 40 is slightly projected from the annular projected edge portion 18 formed around the battery attachment portion 7.

The pin-shaped power supply terminals 8, 9 are projected from the inside of the wristwatch body 11 at the central portion of the battery attachment portion 7. Under the condition that the film-shaped battery 40 is bonded to the battery attachment portion 7, the positive and negative electrode portions 51, 52 of the film-shaped battery 40 respectively contact with and are connected to the power supply terminals 8, 9 to energize the wristwatch 11.

A battery detachable recess 19 is formed on a part of the projected edge portion 18 in the battery attachment portion 7. When the film-shaped battery 40 is detached from the battery attachment portion 7, the user can easily detach the film-shaped battery 40 from the battery attachment portion 7 by inserting a tool, such as a minus-screwdriver or the like, into the recess 19.

As described above, according to the inventive film-shaped battery for the wristwatch, when the film-shaped battery 40 is attached to the battery attachment portion 7, the film-shaped battery 40 can be bonded to the battery attachment portion 7 of the wristwatch body 11 with ease. When the film-shaped battery 40 is detached from the battery attachment portion 7 of the wristwatch body 11, the user can detach the film-shaped battery 40 from the battery attachment portion 7 with ease by inserting the minus-driver or the like into the recess 19. Therefore, the user can exchange the battery with ease.

Since the film-shaped battery 40 is bonded to the battery attachment portion 7, the battery lid 10 that is required by the wristwatch shown in FIG. 2 can be removed. Therefore, even when the battery lid is lost, the wristwatch can be prevented from becoming useless.

Further, under the condition that the film-shaped battery 40 is attached to the battery attachment portion 7, the power supply terminals 8, 9 and the electrode portions 51, 52 can be hermetically shielded by the adhesive seal 53. Therefore, the power supply terminals 8, 9 and the electrode portions 51, 52 can be prevented from being smudged by water and dust, thereby maintaining a water-proof property and a dust-proof property.

In particular, according to this embodiment, under the condition that the film-shaped battery 40 is attached to the battery attachment portion 7, the film-shaped battery 40 is slightly projected from the projected edge portion 18. Therefore, when the user wears the wristwatch body 11 on the wrist, the whole of the film-shaped battery 40 is brought in contact with the skin of user's wrist. Although it is customary that a life of a battery is reduced under cold circumstances, according to this embodiment, the film-shaped battery 40 is warmed by the user's wrist skin. Hence, the life of battery can be kept long.

FIGS. 13 through 19 show an inventive flat film-shaped battery which is applied to a card-type remote controller.

In this remote controller, the film-shaped battery 40 is bonded to the battery attachment portion 7 formed on the rear surface of the remote controller body 12.

Figure 17:
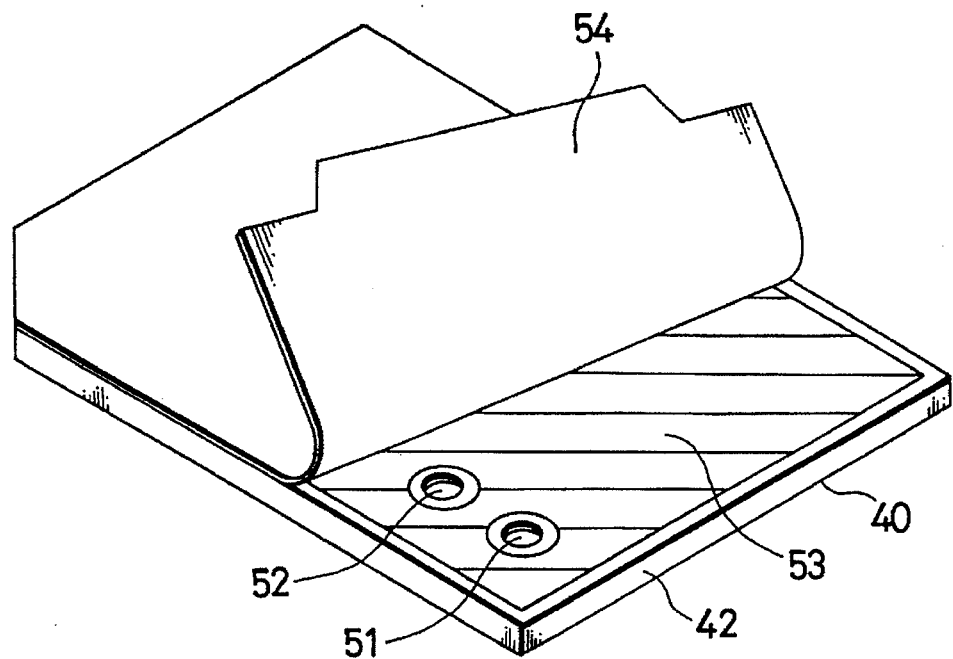
FIG. 17 is a perspective view showing the film-shaped battery used in the above embodiment.

The inventive film battery 40 used in this embodiment will be described with reference to FIGS. 17 through 19. As illustrated, the inventive film-shaped battery 40 of this embodiment is made to be of a so-called credit-card size of rectangular shape. One corner portion of the film-shaped battery 40 is bevelled.

While the inside structure of the film-shaped battery 40 is fundamentally the same as that of the film-shaped battery of disc-configuration shown in FIGS. 8 to 10, the structures of the electrode portions 51 and 52 are different.

Figure 18:
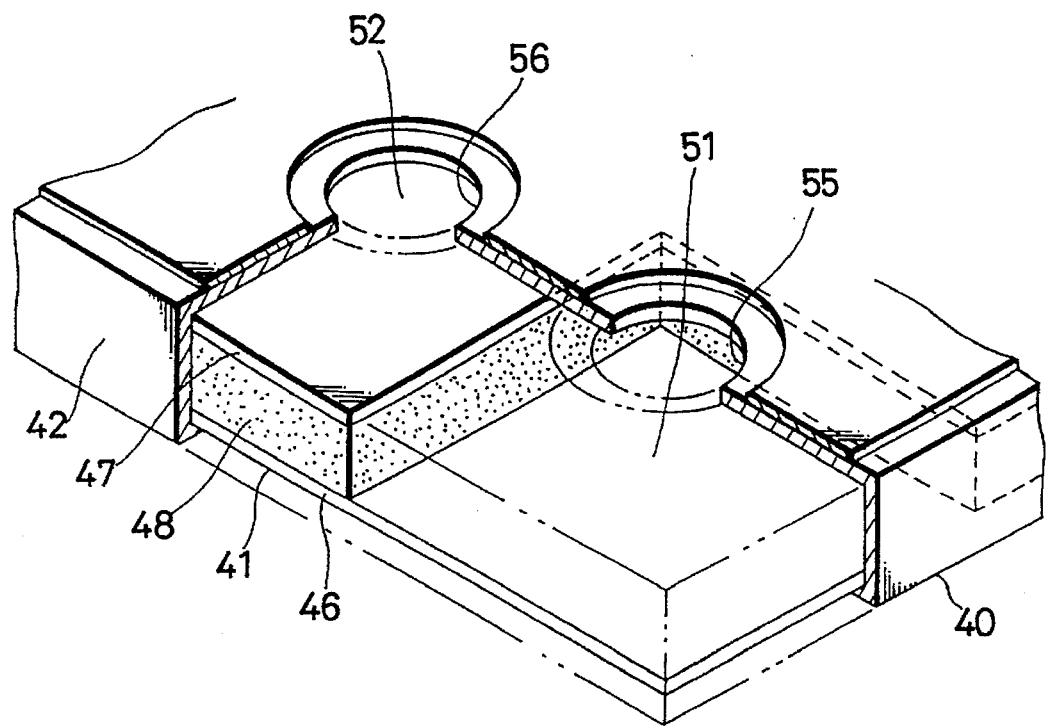
FIG. 18 is a perspective view showing, partly in cutaway form, of a portion of the electrode portion of the film-shaped battery.
Figure 19:
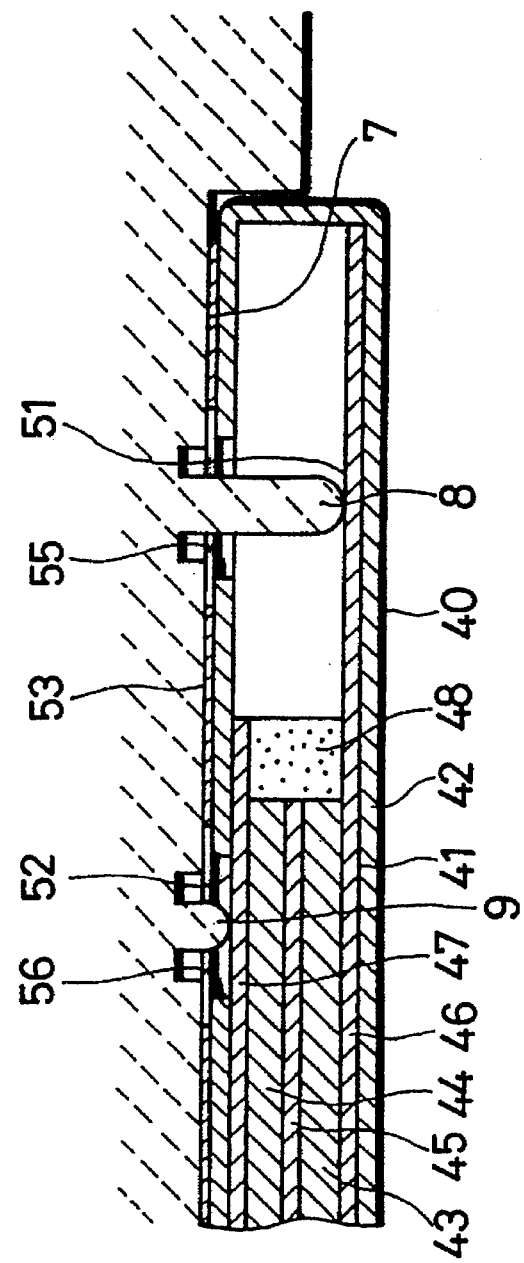
FIG. 19 is a longitudinal cross-sectional view of the portion of the electrode portion.

As shown in FIG. 18 in detail, the insulating outer sheathing member 42 of the film-shaped battery 40 has a pair of holes 55 and 56 defined therein. A part of the negative-polarity current collecting member 47 of the battery body 41 exposed from one hole 56 is served as the negative electrode portion 52.

A part of the battery body 41 opposing the other hole 55 has a recess structure except for the positive-polarity current collecting member 46. A part of the positive-polarity current collecting member 46 exposed from the hole 55 is served as the positive electrode portion 51.

The remote controller body 12 has the battery attachment portion 7 to which the film-shaped battery 40 is attached. The battery attachment portion 7 is shaped in correspondence with the outer form of the film-shaped battery 40. In other words, the battery attachment portion 7 is bevelled at one portion of its corner portion in a recessed rectangular shape. The adhesive seal 53 of the film-shaped battery 40 is bonded to the flat surface of the bottom portion of the battery attachment portion 7.

The battery attachment portion 7 has the pin-shaped power supply terminals 8, 9 projected at its positions opposing the electrode portions 51, 52 of the film-shaped battery 40. Therefore, under the condition that the film-shaped battery 40 is attached to the battery attachment portion 7 by bonding, the positive-polarity and negative-polarity portions 51, 52 of the film-shaped battery 40 are respectively contacted with and connected to the power supply terminals 8, 9, thereby to energize the remote controller.

Figure 14:
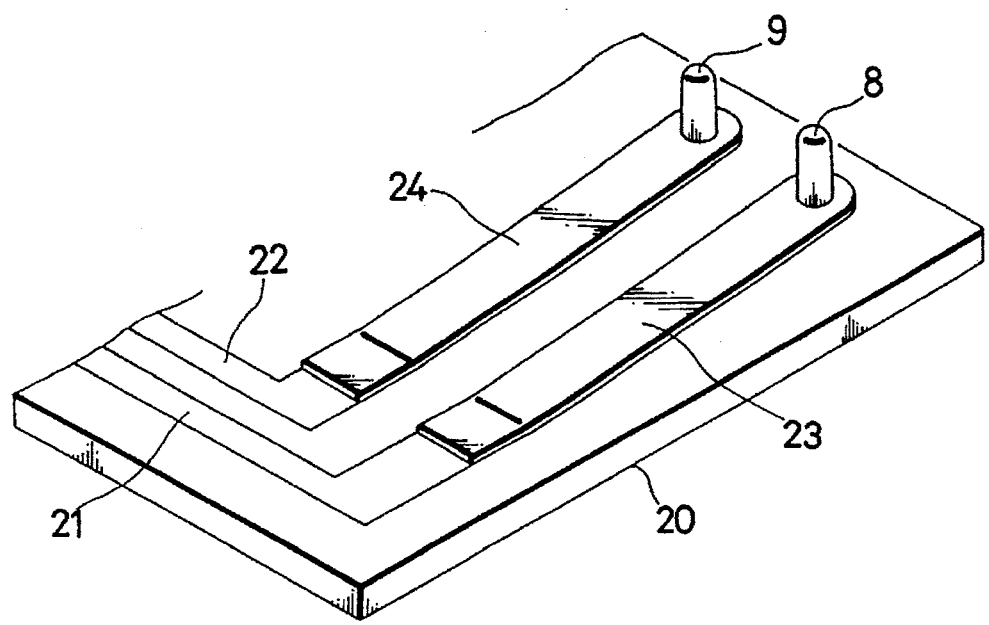
FIG. 14 is a perspective view used to explain a structure of power supply terminals in the remote controller.

In the remote controller to which the inventive film-shaped battery is applied, as shown in FIG. 14, the power supply terminals 8, 9 are respectively disposed on tip end portions of leaf springs 23, 24 bonded on circuit patterns 21, 22 of a printed circuit board 20 provided within the remote controller. When the film-shaped battery 40 is attached to the battery attachment portion 7, the electrode portions 51, 52 of the film-shaped battery 40 push the power supply terminals 8, 9 to flex the leaf springs 23, 24 respectively so that spring-biasing forces of the leaf springs 23, 24 urge the power supply terminals 8, 9 against the electrode portions 51, 52 of the film-shaped battery 40, respectively.

According to this embodiment, the remote controller also has the battery detachable recess 19. As shown in FIG. 16, the user can easily detach the film-shaped battery 40 from the battery attachment portion 7 by inserting a proper means, such as a coin or the like into the recess 19.

The film-shaped battery 40 has a portion 57 corresponding to the battery detachable recess 19 on which portion 57 there is not formed the adhesive seal 53.

As described above, in the remote controller, the film-shaped battery 40 can be easily attached to the battery attachment portion 7 of the remote controller body 12 by bonding. When the film-shaped battery 40 is detached from the battery attachment portion 7, the user can easily detach the film-shaped battery 40 from the battery attachment portion 7 by inserting a coin or the like into the recess 19. Therefore, the user can exchange the battery with ease.

Since the film-shaped battery 40 is attached to the battery attachment portion 7 by bonding, the battery holder 15 that is required by the remote controller shown in FIG. 3 can be removed and hence the remote controller body 12 can be simplified in its inside structure. Moreover, the film-shaped battery 40 has a thickness as very thin as 0.2 to 0.5 mm as described before. Therefore, even when this film-shaped battery 40 is bonded to the battery attachment portion 7 of the remote controller body 12, the thickness of the remote controller body 12 is not increased substantially. Thus, the remote controller can be reduced in thickness significantly.

Further, under the condition that the film-shaped battery 40 is attached to the battery attachment portion 7, the adhesive seal 53 hermetically shields the power supply terminals 8, 9 and the electrode portions 51, 52 to prevent the power supply terminals 8, 9 and the electrode portions 51, 52 from being smudged by water or the like even when the remote controller is soaked with water or the like inadvertently at the dining table.

Furthermore, according to this embodiment, since the film-shaped battery 40 and the battery attachment portion 7 to which the film-shaped battery 40 is bonded are not merely rectangular but are bevelled at one portion of the corner, this recessed portion serves as the guide portion to prevent the user from attaching the film-shaped battery 40 to the battery attachment portion 7 from the wrong direction. Therefore, the electrode portions 51, 52 can reliably be opposed to and connected to the power supply terminals 8, 9.

In addition, in the portions in which the electrode portions 51, 52 are connected to the power supply terminals 8, 9, the spring-biasing forces from the leaf springs 23, 24 can urge the power supply terminals 8, 9 against the electrode portions 51, 52 to be connected reliably thereby a stable conducted state is maintained.

Figure 20:
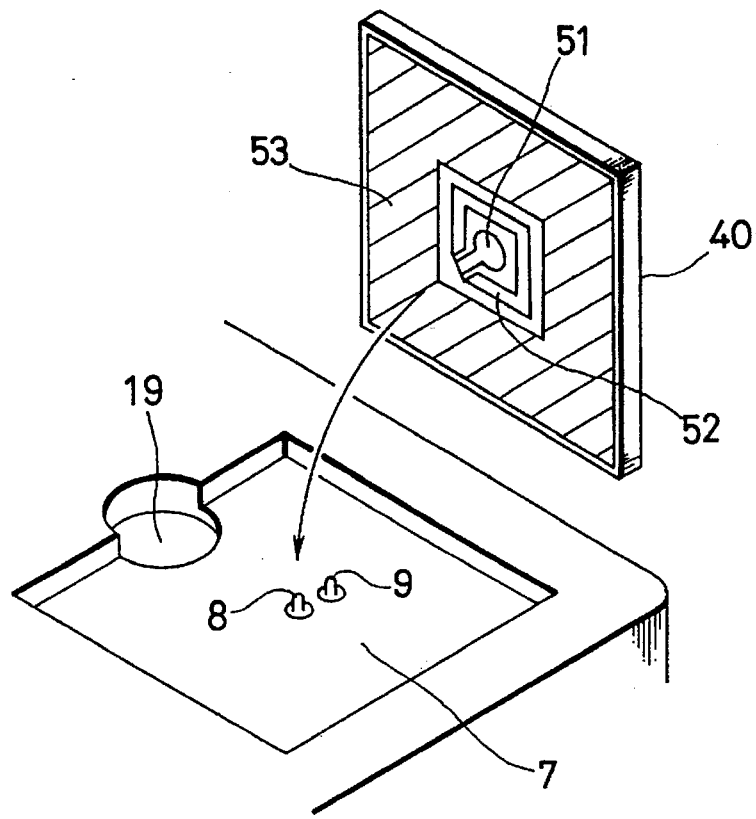
FIG. 20 is a schematic diagram showing a film-shaped battery according to a further embodiment of the present invention.
Figure 21:
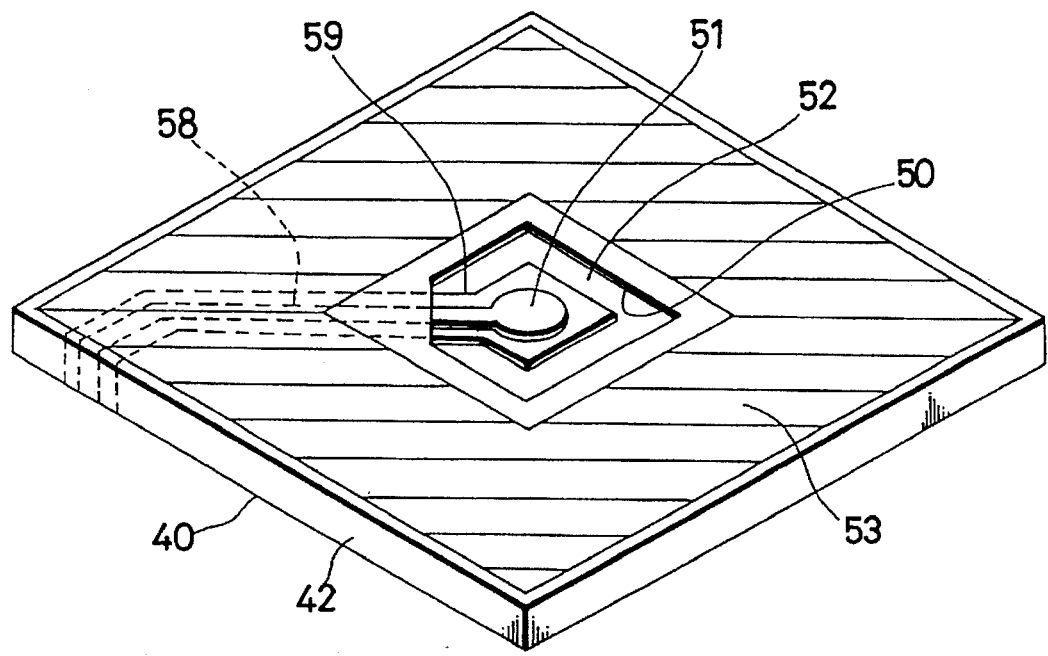
FIG. 21 is a perspective view showing the film-shaped battery shown in FIG. 20.
Figure 22:
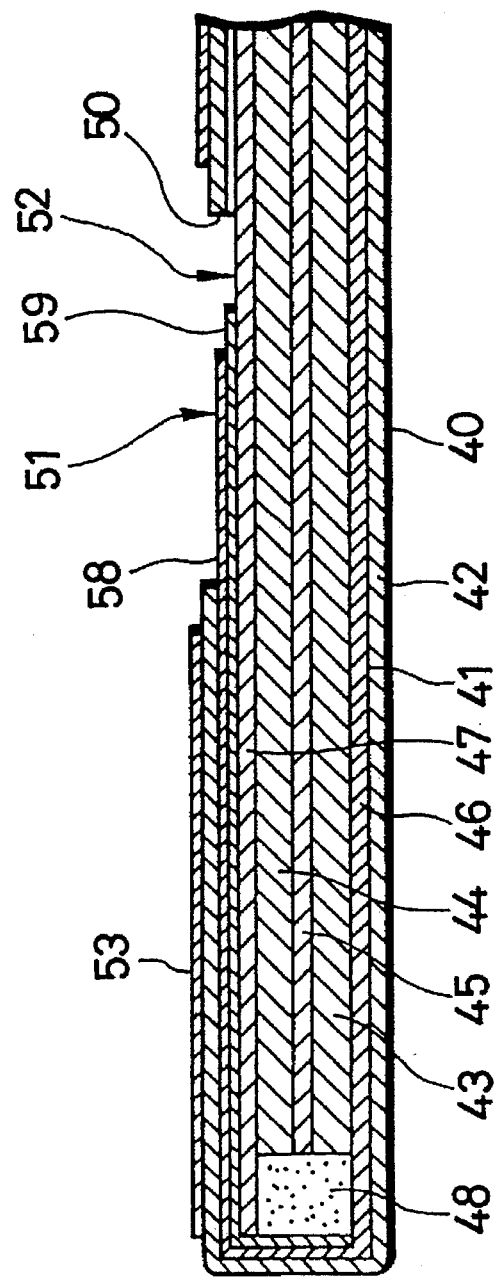
FIG. 22 is a longitudinal cross-sectional view of the film-shaped battery shown in FIG. 20.

FIGS. 20 to 22 show a film-shaped battery according to a further embodiment of the present invention.

As illustrated, the film-shaped battery 40 of the embodiment is made square in shape. The negative-polarity current collecting member 47 of the battery body 41 exposed from the hole 50 defined at the central portion of the insulating outer sheathing member 42 is served as the negative electrode portion 52. An extended pattern 58 of narrow width is elongated from the positive-polarity current collecting member 46 to the central portion at which it is exposed to the hole 50. A tip end portion of this extended pattern 58 is served as the positive electrode portion 51.

An insulating plate 59 is interposed between the extended pattern 58 extended from the positive-polarity current collecting member 46 and the negative-polarity current collecting member 47.

The battery attachment portion 7 to which the film-shaped battery 40 is attached is concaved in a square shape corresponding to an outer form of the film-shaped battery 40. When the film-shaped battery 40 is attached to the battery attachment portion 7, the positive and negative electrode portions 51, 52 are contacted with and connected to the power supply terminals 8, 9, respectively.

According to this embodiment, since the direction in which the extended pattern 58 is formed in the film-shaped battery 40 is shifted by 45 degrees from the direction in which the power supply terminals 8, 9 are disposed, the power supply terminals 8 and 9 can avoid contact with the extended pattern 58 (positive-polarity portion 51) simultaneously.

Further, according to this embodiment, since the film-shaped battery 40 and the battery attachment portion 7 are made square, the film-shaped battery 40 can be attached to the battery attachment portion 7 from any directions. Therefore, this film-shaped battery 40 can be attached to the battery attachment portion 7 with ease as compared with the card-type film-shaped battery shown in FIGS. 17 to 19.

Figure 23:
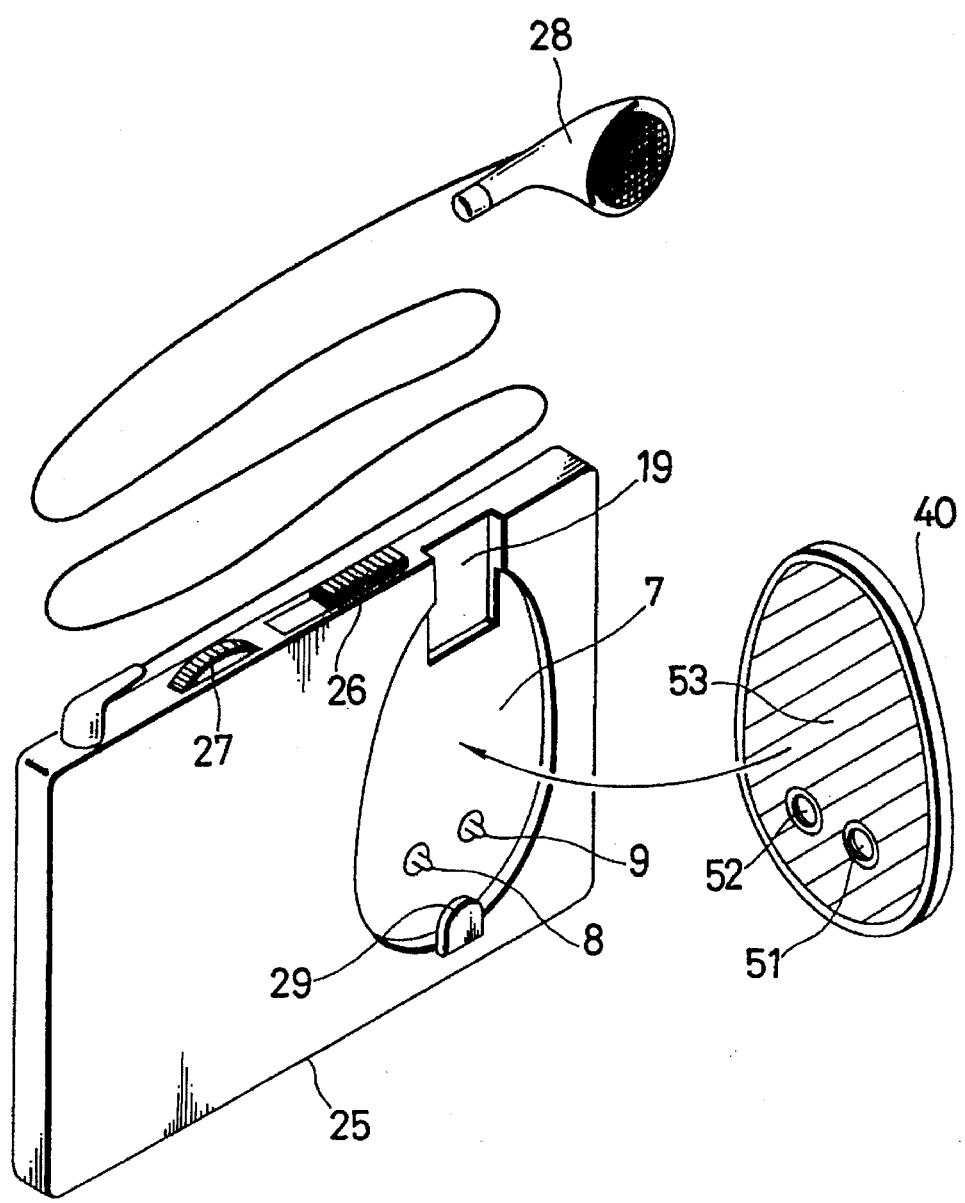
FIG. 23 is a perspective view showing a card-type radio receiver using an inventive film-shaped battery according to a further embodiment of the present invention.
Figure 24:
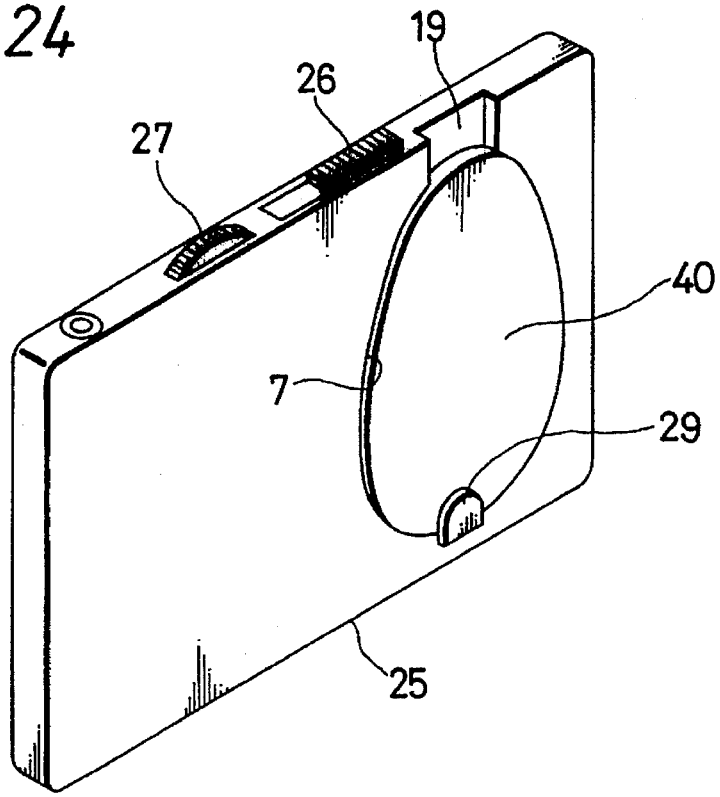
FIG. 24 is a perspective view showing the state that the film-shaped battery is attached to the battery attaching portion of the radio receiver.
Figure 25:
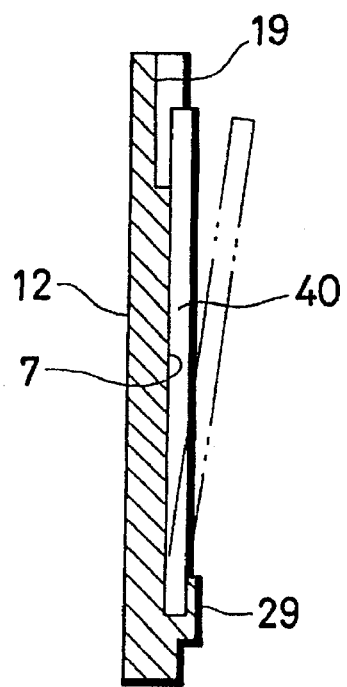
FIG. 25 is a side view used to explain the state that the film-shaped battery is attached to the battery attaching portion of the radio receiver.

FIGS. 23 through 25 show a so-called card type radio receiver to which the inventive film-shaped battery is attached.

As illustrated, the card type radio receiver includes a radio receiver body 25, an on/off switch serving also as a volume 26, a tuning dial 27 and an earphone 28. When a film-shaped battery 40 of an egg-shape is attached to the battery attachment portion 7 provided on the surface of the radio receiver body 25 by bonding, the positive and negative electrode portions 51, 52 of the film-shaped battery 40 are respectively contacted with and connected to the power supply terminals 8, 9 on the radio receiver body 25 side to thereby energize this radio receiver.

According to this embodiment, the radio receiver body 25, in particular, includes an ancillary support member 29 projected from the edge portion of the battery attachment portion 7. Therefore, when the film-shaped battery 40 is attached to the battery attachment portion 7, the ancillary support member 29 supports a part of the film-shaped battery 40 to cause the electrode portions 51, 52 and the power supply terminals 8, 9 to be connected together more reliably.

Figure 26:
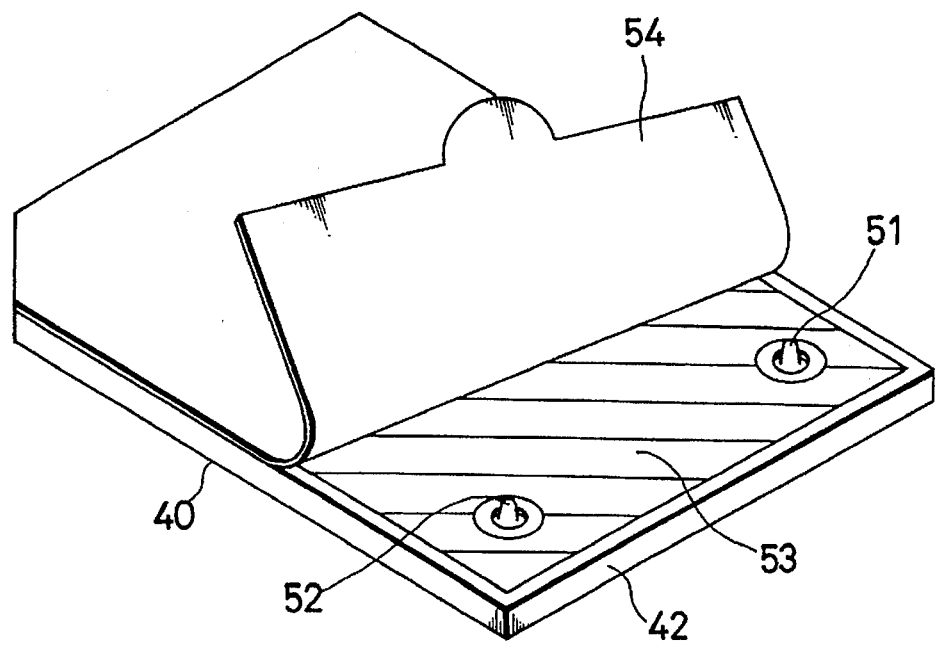
FIG. 26 is a perspective view showing a film-shaped battery according to a further embodiment of the present invention.
Figure 27:
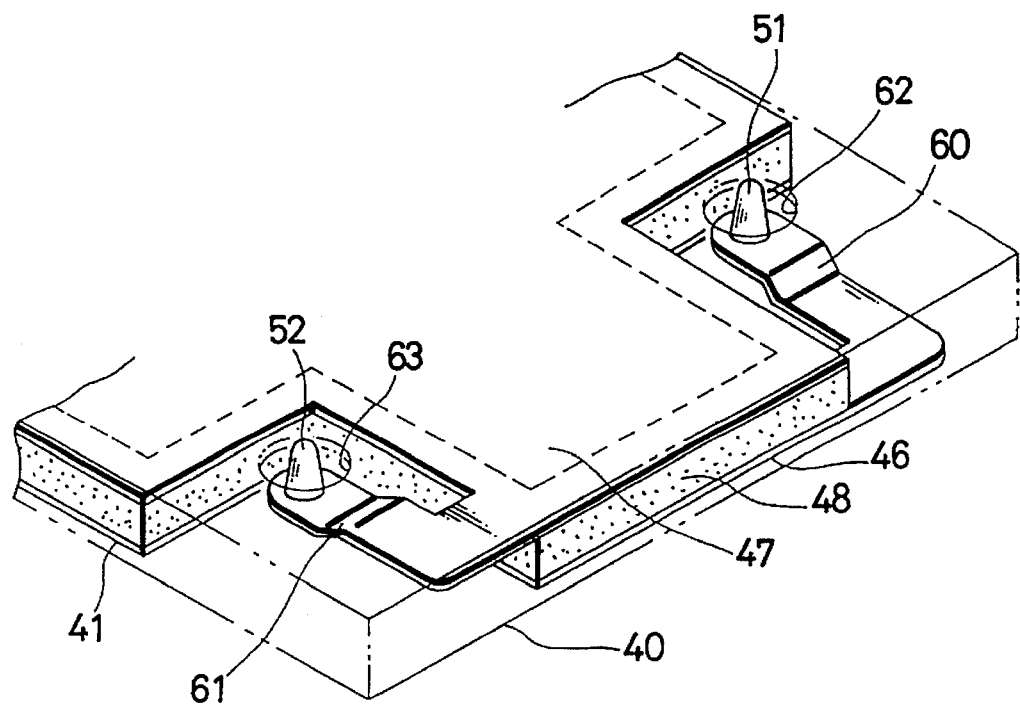
FIG. 27 is a perspective view showing a structure of electrode portions of the film-shaped battery.
Figure 28A:
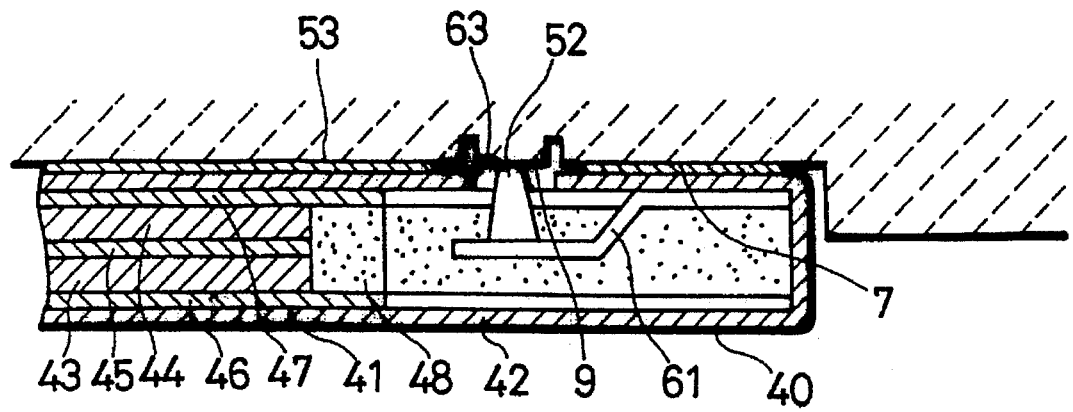
FIG. 28A is a longitudinal cross-sectional view showing the electrode portion seen from a negative electrode portion side thereof.
Figure 28B:
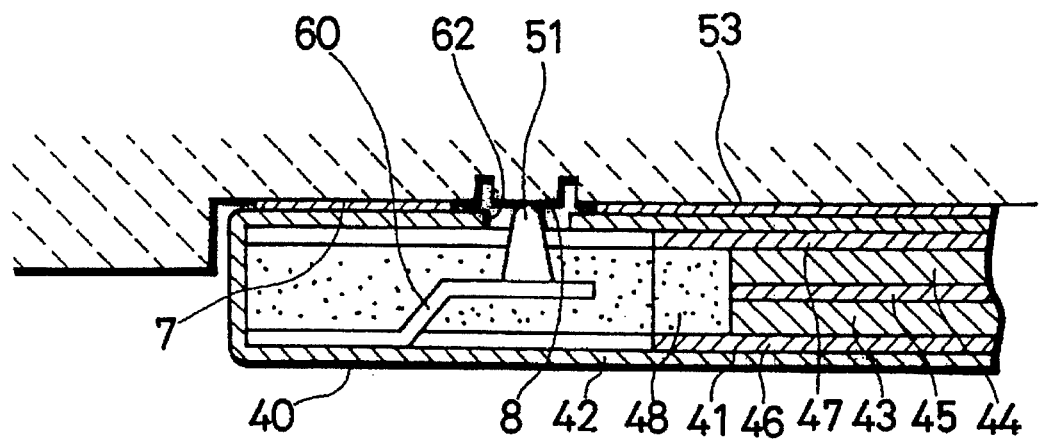
FIG. 28B is a longitudinal cross-sectional view showing the electrode portion seen from a positive electrode portion side thereof.

FIGS. 26 through 28 show the electrode portion of the film-shaped battery according to a further embodiment of the present invention.

As illustrated, the inventive film-shaped battery 40 forms a resilient plate portion 60 by elongating a part of the positive-polarity current collecting member 46 of the housed battery body 41. The inventive film-shaped battery 40 forms also a resilient plate portion 61 by elongating a part of the negative-polarity current collecting member 47. These resilient plate portions 60, 61 have formed at their tip end portions pin-shaped protrusions which are served as the positive and negative electrode portions 51, 52 projected from holes 62, 63.

In the inventive film-shaped battery 40 thus arranged, even when the power supply terminals 8, 9 on the electronic device side are the fixed terminals, the electrode portions 51, 52 are urged against and connected to the power supply terminals 8, 9 by a pressure, thereby maintaining the stable conducted state.

Specifically, under the condition that the inventive film battery 40 is attached to the battery attachment portion 7 of the electronic device by bonding, the power supply terminals 8, 9 push the electrode portion 51, 52 to flex the resilient plate portions 60, 61, respectively. As a result, the spring-biasing forces from the resilient plate portions 60, 61 urge the electrode portions 51, 52 against the power supply terminals 8, 9 respectively so that the electrode portions 51, 52 are connected to the power supply terminals 8, 9 reliably.

While the resilient plate portions 60, 61 are integrally elongated from the positive-electrode current collecting member 46 and the negative-polarity current collecting member 47 of the battery body 41, respectively, the present invention is not limited thereto and the following variant is also possible. That is, the resilient plate portions 60, 61 are prepared as different assemblies and may be respectively attached to the positive-polarity current collecting member 46 and the negative-polarity current collecting member 47 of the battery body 41 by a proper method, such as welding or the like. Further, coil-shaped or steel-wire shaped springs/ electrode portions 51, 52 are formed and directly attached to the positive-polarity current collecting member 46 and the negative-polarity current collecting member 47 of the battery body 41, respectively.

Figure 29:
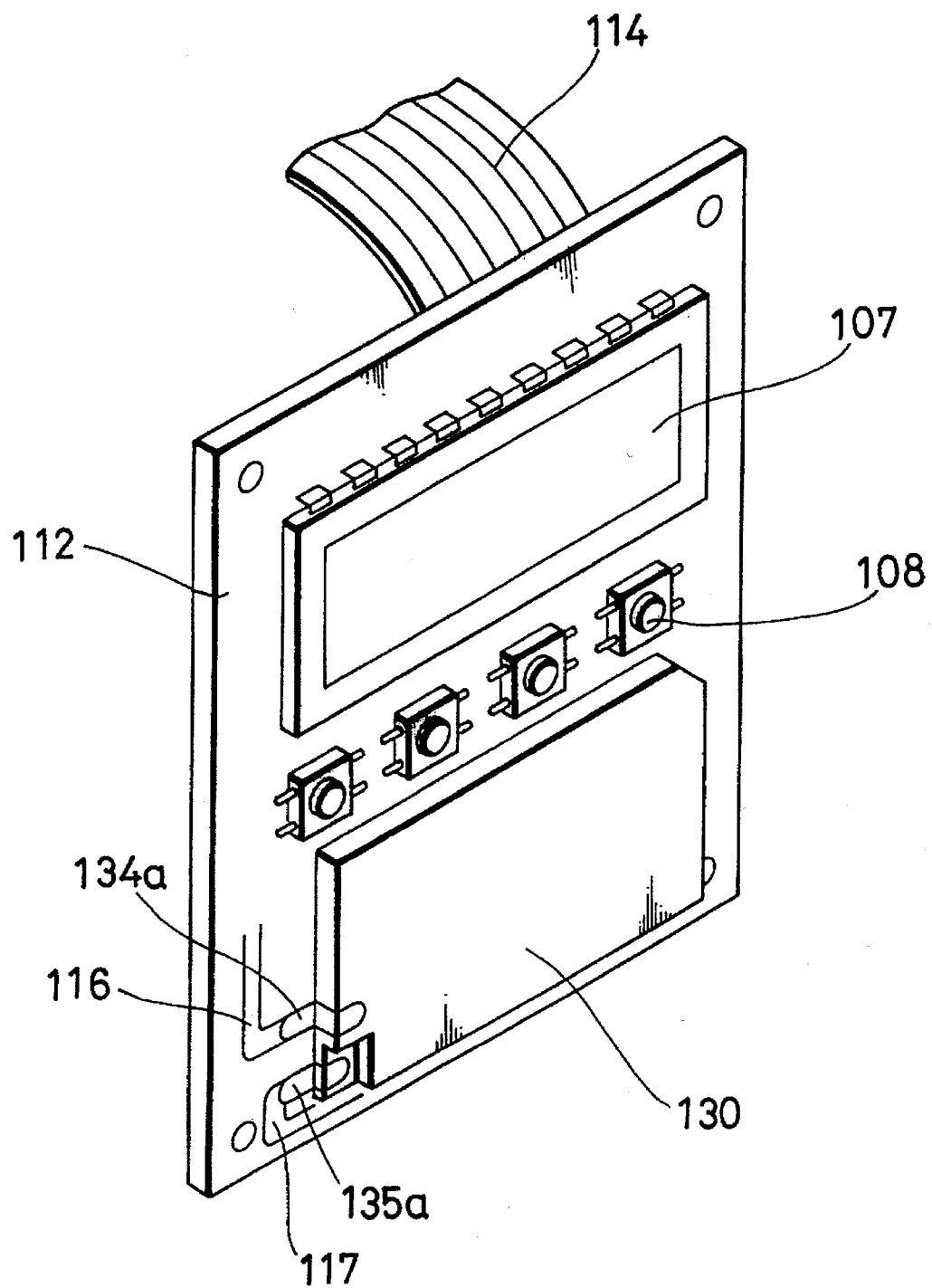
FIG. 29 is a perspective view of a substrate to which a film-shaped battery according to a further embodiment of the present invention is bonded.
Figure 30:
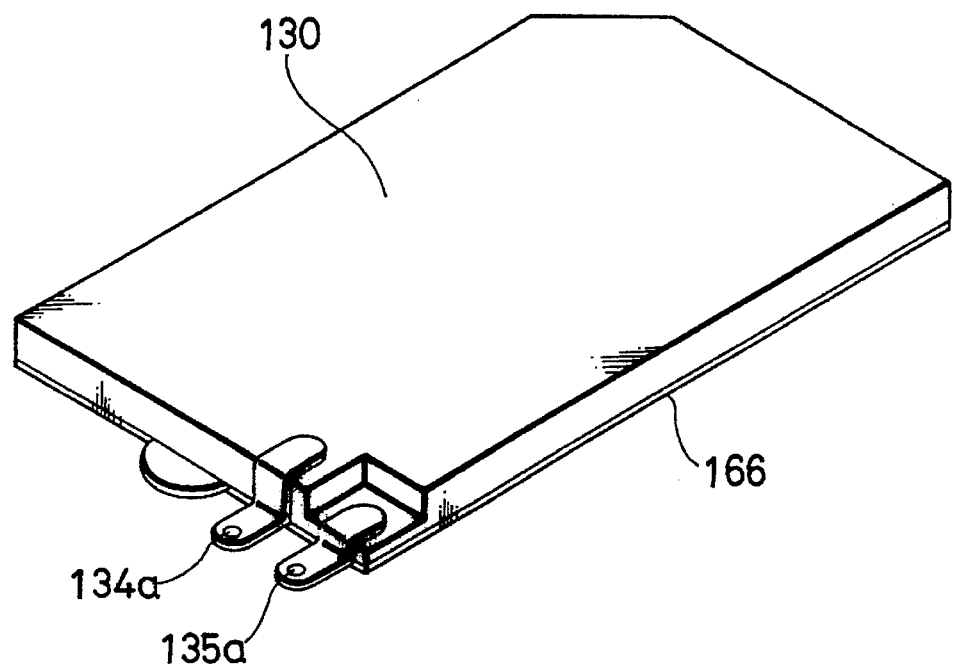
FIG. 30 is a perspective view of the film-shaped battery.
Figure 31:
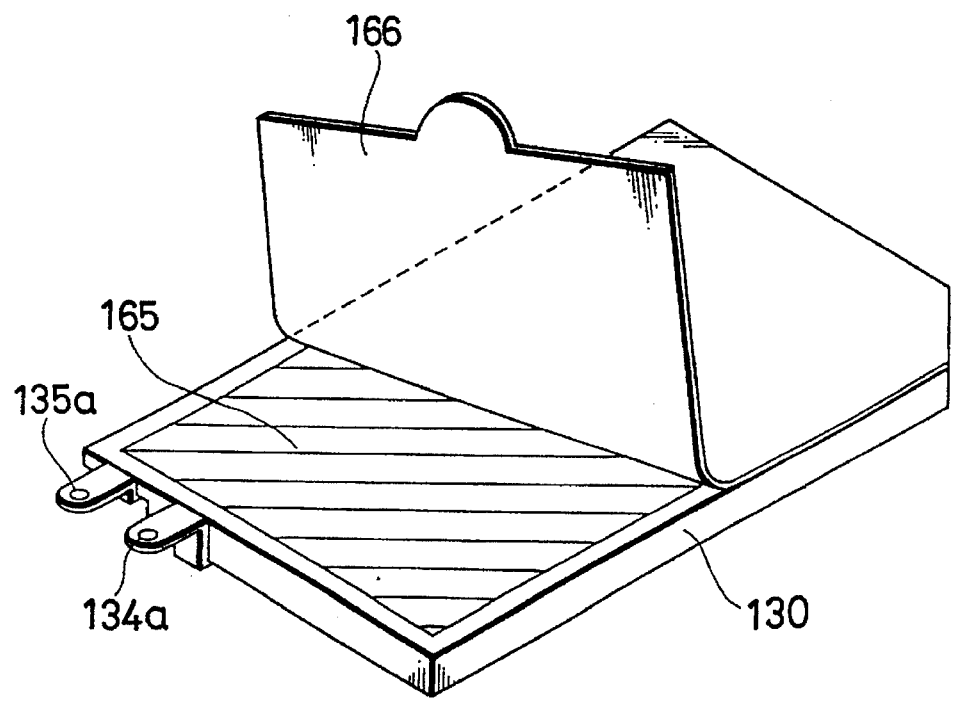
FIG. 31 is a perspective view showing the film-shaped battery from its rear surface side.

FIGS. 29 to 31 show a battery according to a further embodiment of the present invention wherein a film-shaped battery is bonded to a space of a substrate if it has a large space. FIG. 29 is a perspective view showing a substrate 112 to which a film-shaped battery is bonded. FIG. 30 is a perspective view of a film-shaped battery 130. FIG. 31 is a perspective view showing the film-shaped battery 130 from the rear surface thereof.

As shown in FIG. 31, the inventive film-shaped battery 130 of the embodiment includes an adhesive surface 165 formed on its rear surface. When the film-shaped battery 130 is bonded to a substrate 112, a protecting paper 166 covering the adhesive surface 165 is peeled and the adhesive surface 165 is closely contacted with the substrate 112. Concurrently therewith, power supply terminals 134a, 135a projected from the outer sheathing member of the film-shaped battery 130 are fixed to and connected to patterns 116, 117 of the substrate 112 by a proper method, such as soldering or the like.

In FIG. 29, reference numerals 107 and 108 depict a liquid crystal panel and change-over switches, respectively. Reference numeral 114 designates a flexible printed-circuit board to connect electronic circuits on the substrate 112 to those on other substrate, through not shown.

According to this embodiment, in this way, the film-shaped battery 130 can be integrally formed with the substrate 112 relatively easily.

Figure 32:
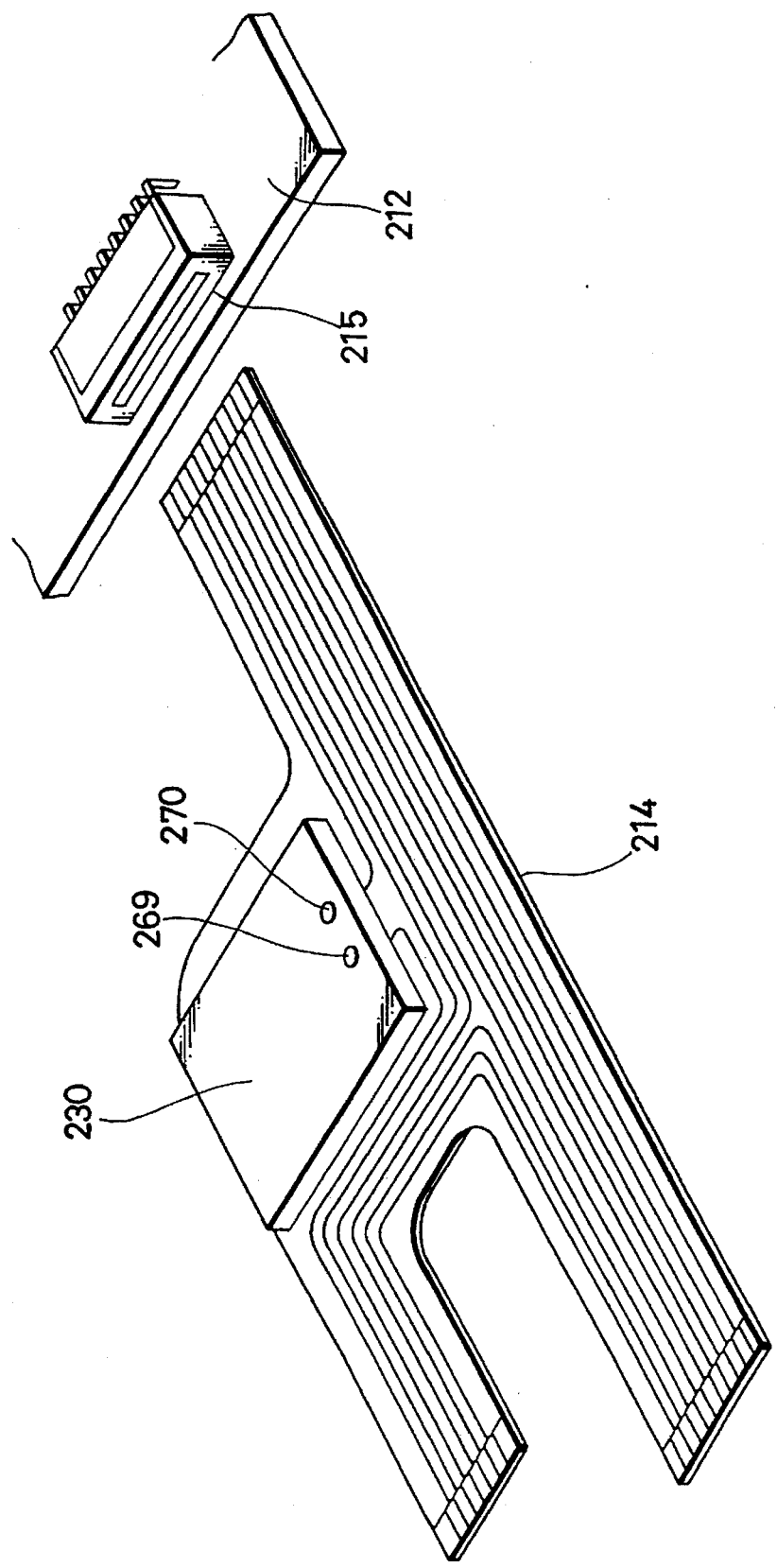
FIG. 32 is a perspective view of a film-shaped battery according to a further embodiment of the present invention and showing a flexible printed circuit board to which the inventive film-shaped battery is attached.
Figure 33:
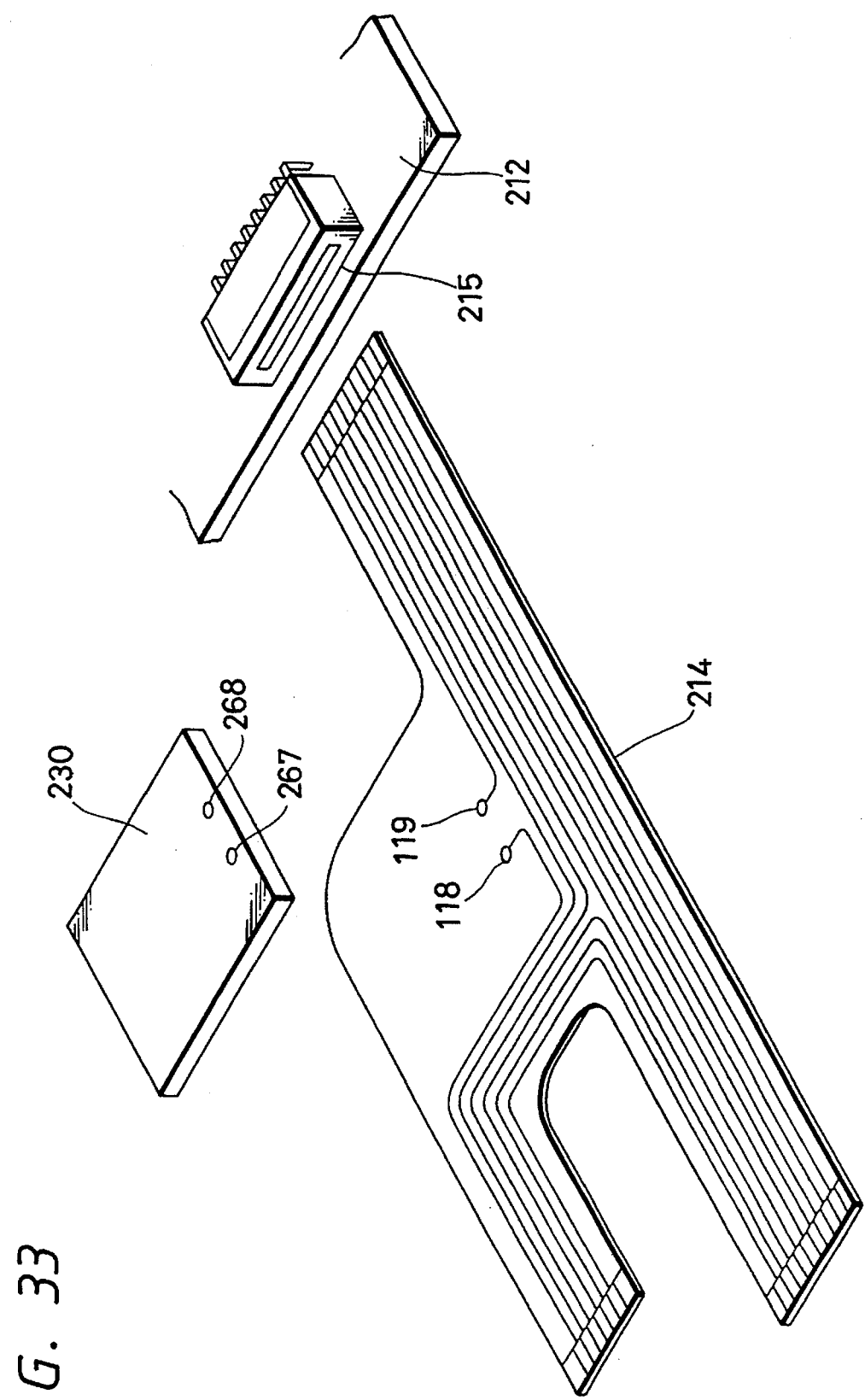
FIG. 33 is an exploded perspective view of the flexible printed circuit board shown in FIG. 32.
Figure 34:
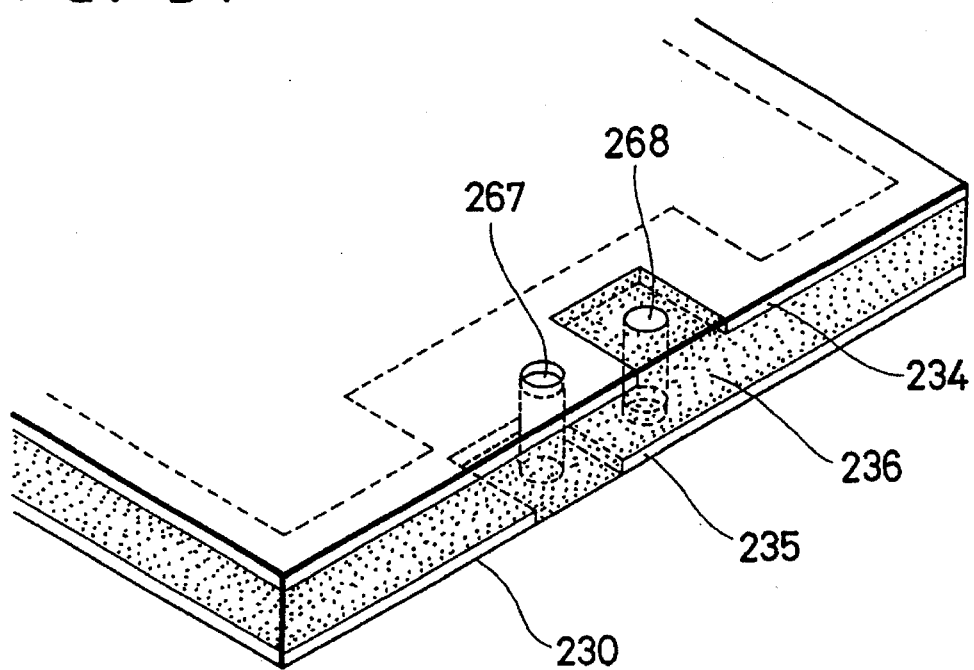
FIG. 34 is a perspective view showing a main portion of the film-shaped battery.
Figure 35:
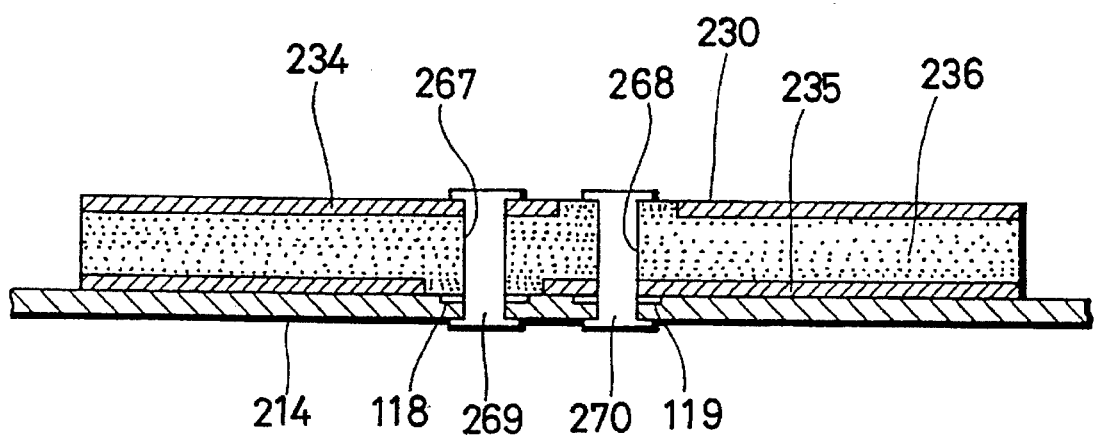
FIG. 35 is a cross-sectional view showing a main portion of the film-shaped battery.

FIGS. 32 through 35 show a film-shaped battery according to a further embodiment of the present invention wherein an inventive film-shaped battery 230 is attached to a flexible printed circuit board 214. FIG. 32 is a perspective view showing the flexible printed circuit board 214 to which the film-shaped battery 230 is attached. FIG. 33 is an exploded perspective view thereof. FIG. 34 is a perspective view showing a part of the film-shaped battery 230. FIG. 35 is a cross-sectional view thereof.

The film-shaped battery 230 includes an adhesive surface formed on its rear surface, though not shown. The film-shaped battery 230 is bonded to a part of the flexible printed circuit board 214 at its adhesive surface.

The film-shaped battery 230 is flexible itself, so that it can be flexed together with the flexible printed circuit board 214 with flexibility.

The film-shaped battery 230 has formed therethrough through-holes 267, 268 communicated with the flexible printed circuit board 214. As shown in FIG. 35, a positive-polarity current collecting member 234 of the film-shaped battery 230 and a pattern 118 of the flexible printed circuit board 214 and a negative-polarity current collecting member 235 of the film-shaped battery 230 and a pattern 119 of the flexible printed circuit board 214 can be conducted by caulking pin-shaped conductors 269, 270 fitted into the through-holes 267, 268, respectively.

The film-shaped battery 230 has the positive-polarity current collecting member 234 instead of the negative-polarity current collecting member 235 formed at its portion in which the though-hole 267 is formed, i.e., the portion through which the conductor 269 is inserted. As a result, the positive-polarity current collecting member 234 is conducted with the pattern 118 of the flexible printed circuit board 214 through the conductor 269. Further, the film-shaped battery 230 has the negative-polarity current collecting member 235 instead of the positive-polarity current collecting member 234 formed at its portion in which the through-hole 268 is formed, i.e., the portion through which the conductor 270 is inserted. As a result, the negative-polarity current collecting member 235 is conducted with the pattern 119 of the flexible printed circuit board 214 through the conductor 270. In place of the conductors, soldering may be used to conduct the flexible printed circuit board with the film-shaped battery.

A further embodiment of the present invention will be described with reference to FIGS. 36 to 40.

Figure 36:
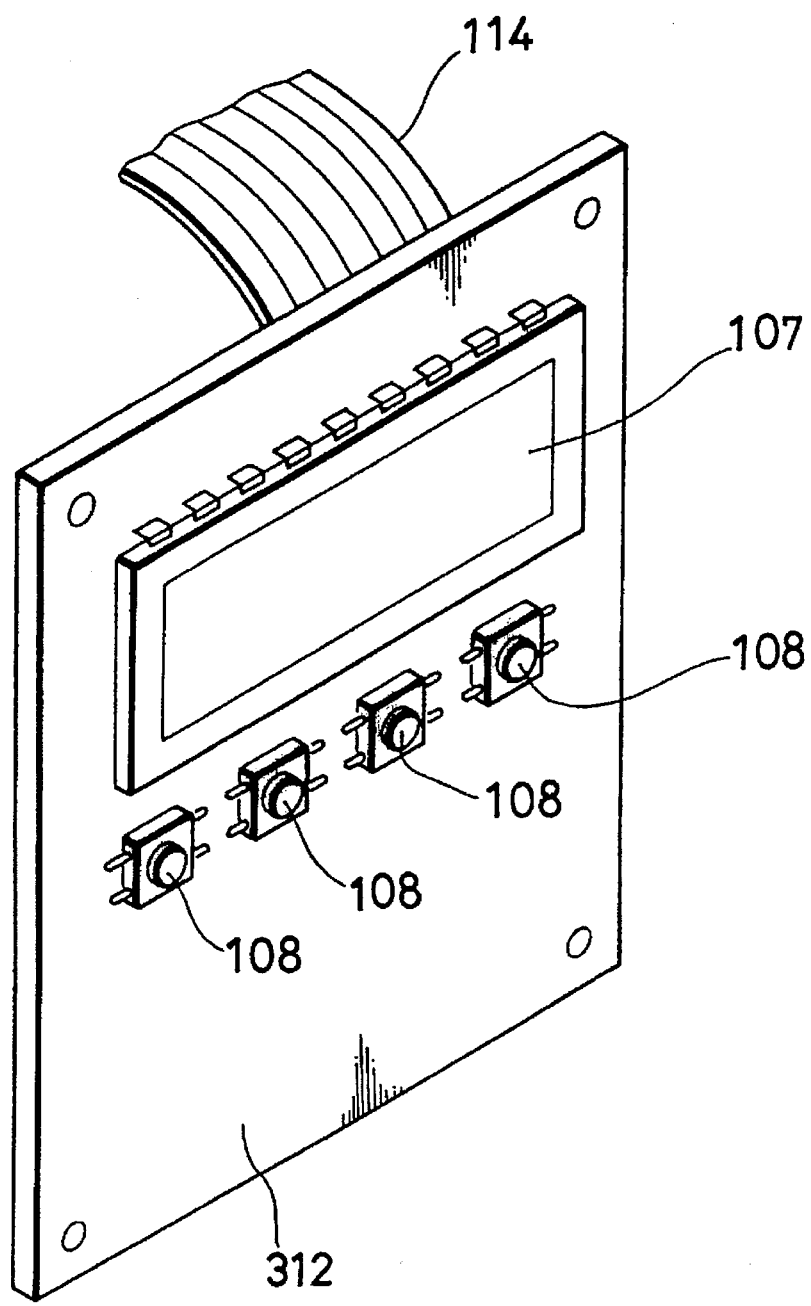
FIG. 36 is a perspective view of a printed circuit board incorporated in a video camera.
Figure 37:
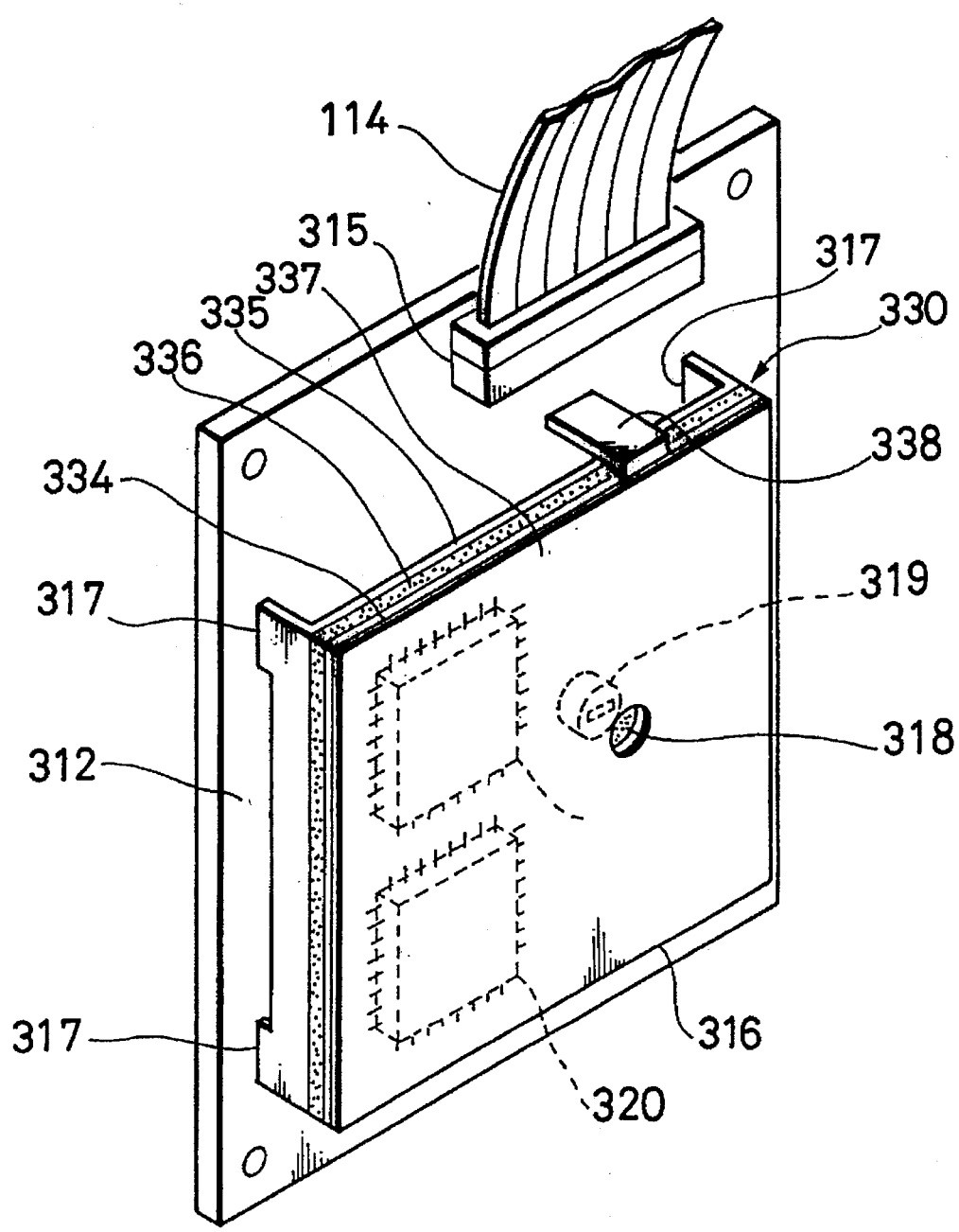
FIG. 37 is a perspective view showing the printed circuit board shown in FIG. 36 from the rear surface side.
Figure 38:
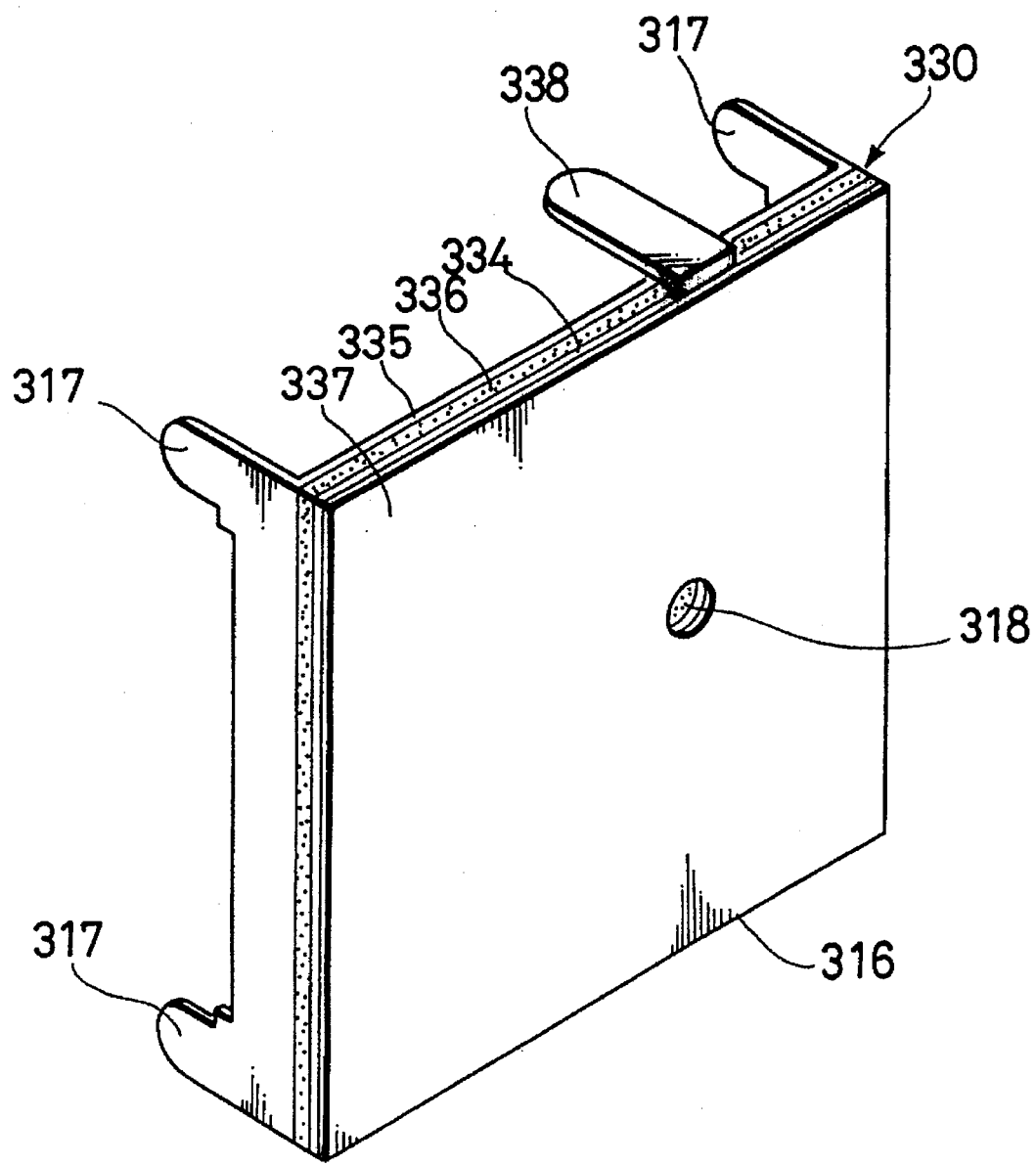
FIG. 38 is a perspective view showing a shield case attached to the printed circuit board.
Figure 39:
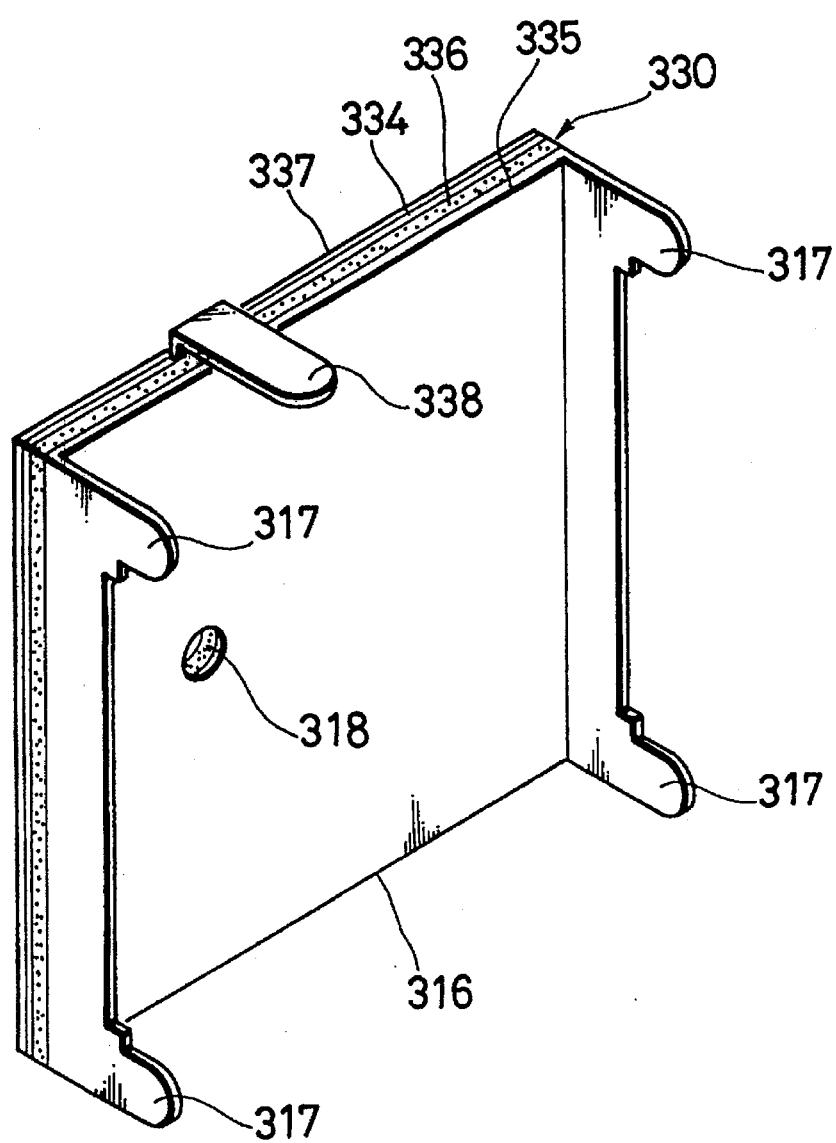
FIG. 39 is a perspective view showing the shield case shown in FIG. 38 from the rear surface side.
Figure 40:
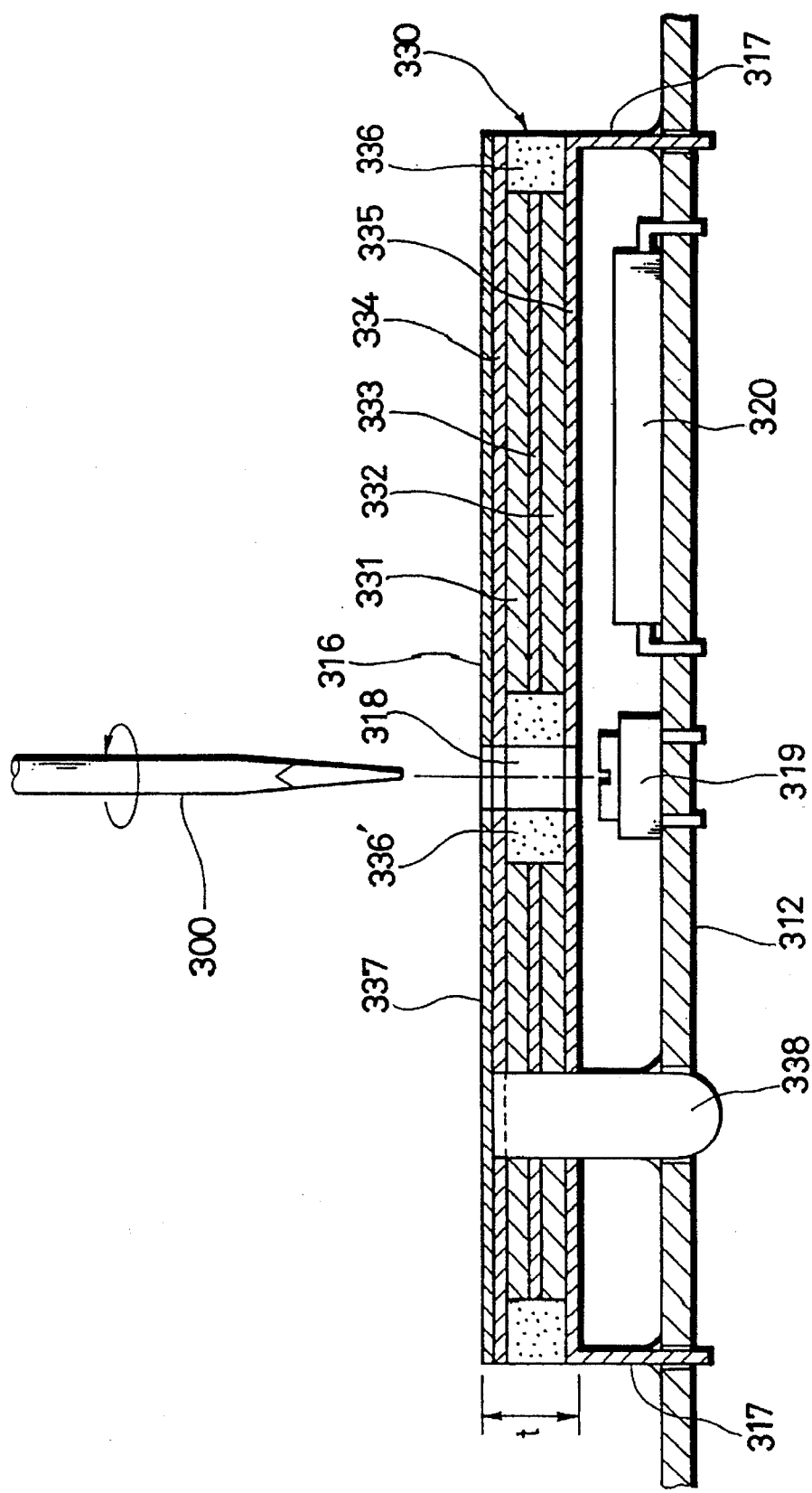
FIG. 40 is a cross-sectional view of the shield case shown in FIG. 38.

FIG. 36 is a perspective view showing a substrate 312 incorporated within the video camera body. FIG. 37 is a perspective view showing the substrate from the rear side thereof. FIG. 38 is a perspective view of a shield case 316 attached to the substrate 312. FIG. 39 is a perspective view showing the shield case 316 from the rear side thereof which is attached to the substrate 312. FIG. 40 is a cross-sectional view of the shield case 316.

As illustrated, according to the present invention, a film-shaped battery 330 is used as a memory backup power supply. The film-shaped battery 330 is assembled as a part of the shield case 316 attached to the inside of the substrate 312.

The film-shaped battery 330 is a thin high performance battery with a high energy density. A fundamental arrangement of the film-shaped battery 330 will be described with reference to FIG. 40. As shown in FIG. 40, a solid poly-electrolyte 333 is disposed between a positive electrode (manganese dioxide, etc.) 331 and a negative electrode (lithium, etc.) 332. The outer peripheries of positive-electrode and negative-polarity current collecting members (serving as outer sheathing members) 334 and 335 each formed of a metal plate (foil) are hermetically shielded by a shield member 336. An insulating plate 337 is deposited on the surface of the positive-polarity current collecting member 334 of the film-shaped battery 330.

The film-shaped battery 330 has a thickness t ranging from about 0.2 to 0.5 mm but the film-shaped battery 330 is drawn thick enough to understand the structure thereof more clearly in exaggerated form in the drawing.

In this embodiment, the film-shaped battery 330 constructs a major surface portion of the shield case 316. Four leg portions 317 of the shield case 316 are integrally extended from the negative-polarity current collecting member 335 of the film-shaped battery 330. At the tip end portion of each of the leg portions 317, the shield case 316 is fixed to the substrate 312 by soldering or the like and also connected to the circuit pattern of the substrate 312.

A leg portion 338 is integrally projected from the positive-electrode current collecting member 334 of the film-shaped battery 330. The tip end portion of the leg portion 338 is fixed to the substrate 312 by soldering or the like and also connected to the circuit pattern of the substrate 312.

Therefore, a current is supplied from the film-shaped battery 330 to an IC 320 on the substrate 312 to back up the memory thereof. Concurrently therewith, undesired radiation (radio waves) generated from the electronic circuit on the substrate 312 is effectively shielded by the film-shaped battery 330.

As described above, according to the present invention, since the electrodes (current collecting members) of the film-shaped battery are made of the thin plate-shaped conductor, i.e., metal, these electrodes can be served also as the shield plates.

Since the film-shaped battery 330 has the thickness t ranging from about 0.2 mm to 0.5 mm as set forth above, it does not increase the thickness of the shield case 316 and can be easily assembled in the shield case as a power supply for backing up the memory. In particular, the shield case 316 is fixed to a large and flat area within the electronic device so that the shield case is the best portion at which the film-shaped battery is disposed.

Since the film-shaped battery 330 is assembled to a part of the shield case 316 as the power supply for backing up the memory, according to this embodiment, the battery holder for the battery and the battery contact members on the substrate used in the prior art become unnecessary. Furthermore, the battery and the capacitor used in the prior art need not be provided.

The shield case 316 has a through-hole 318 formed through the film-shaped battery 330 and the insulating plate 337. Then, the user can adjust a variable electronic assembly 319, such as a variable resistor or the like mounted on the substrate 312 by turning the variable electronic assembly 319 with an adjustment tool 300, such as a screwdriver inserted into the through-hole 318. The film-shaped battery 330 has a sealing member 336 formed around the through-hole 318 in an annular fashion so as to hermetically shield the inside of the battery.

Figure 41:
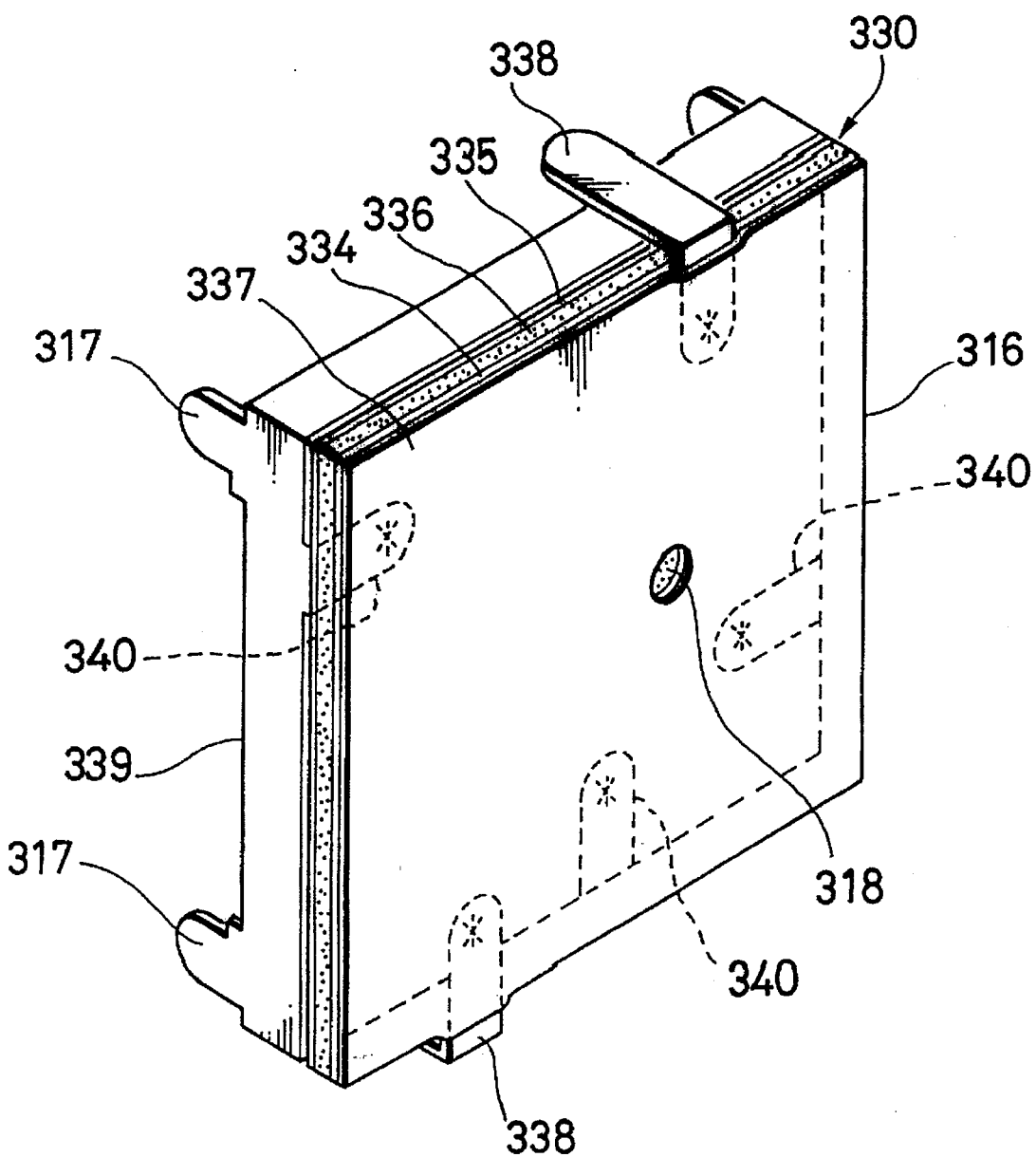
FIG. 41 is a perspective view showing another example of the shield case attached to the printed circuit board.
Figure 42:
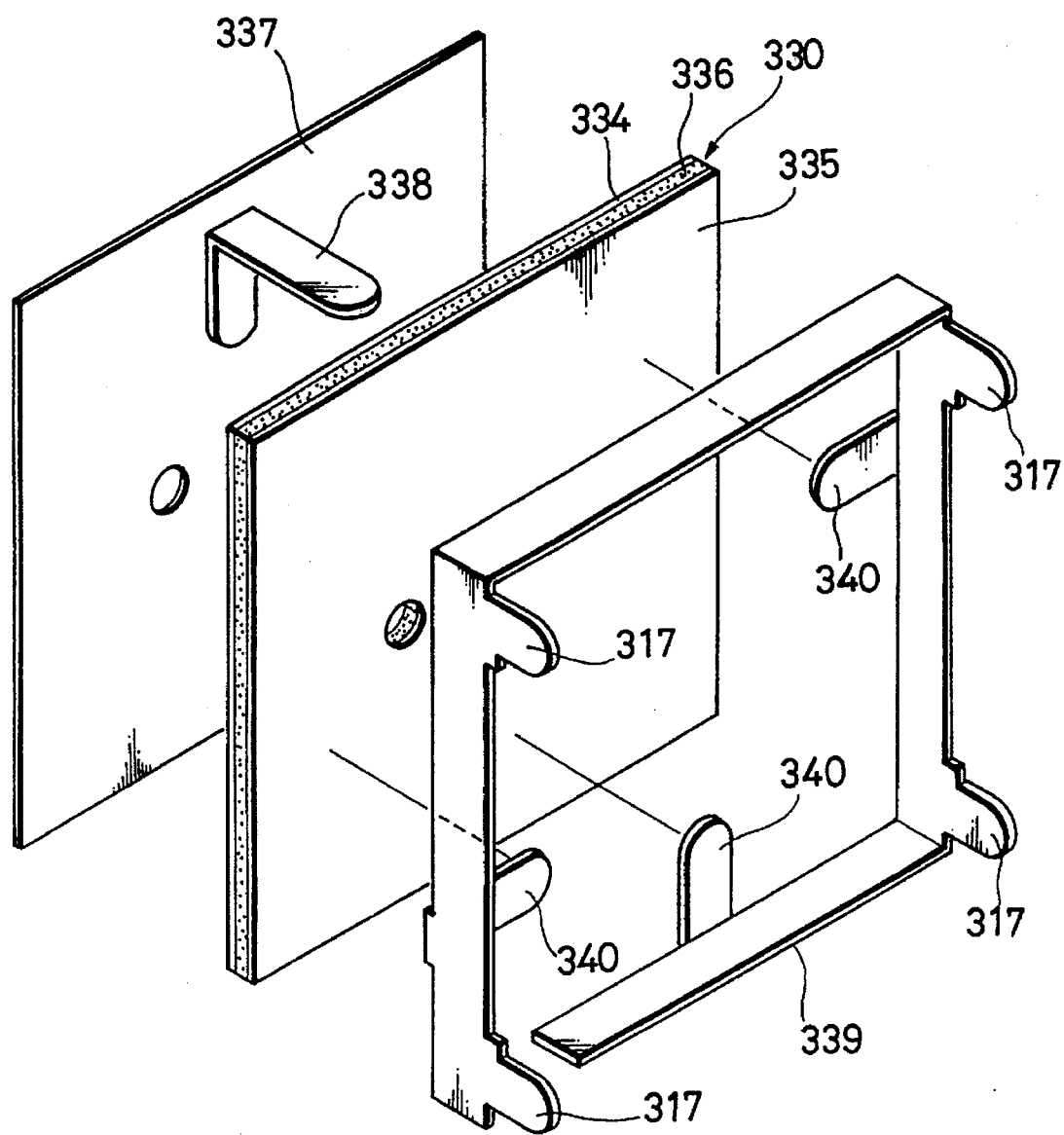
FIG. 42 is an exploded perspective view showing the shield case shown in FIG. 41 from the rear surface side.
Figure 43:
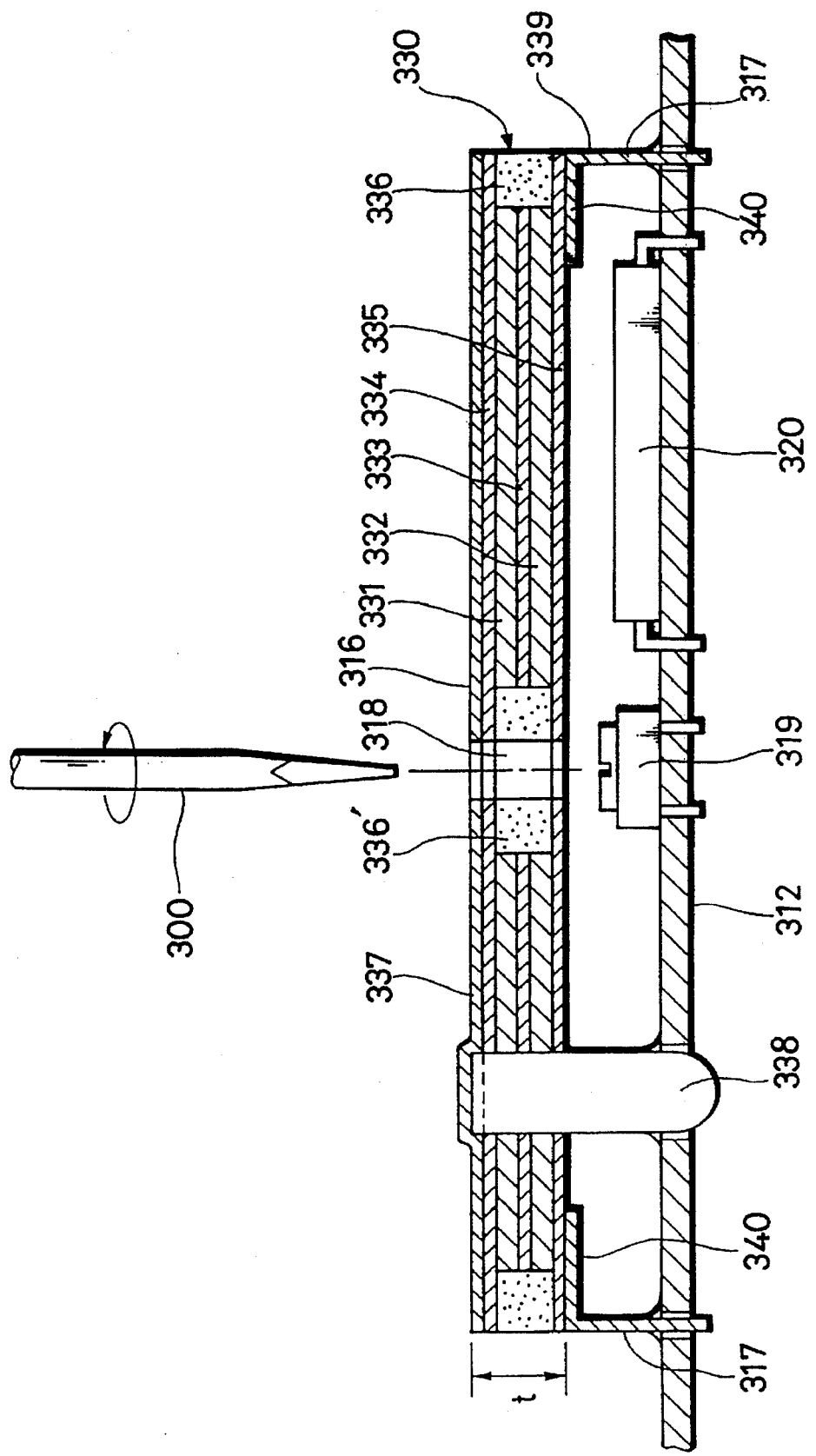
FIG. 43 is a cross-sectional view of the shield case shown in FIG. 41.

FIGS. 41 to 43 show a further embodiment of the present invention. FIG. 41 is a perspective view of a shield case 316. FIG. 42 is an exploded perspective view showing the shield case 316 from the rear side thereof. FIG. 43 is a cross-sectional view of the shield case 316.

In this embodiment, the film-shaped battery 330 is combined with a separate metal plate to construct a part of the shield case 316.

As illustrated, there is provided a frame 339 made of a metal plate (e..g., tin plate). The metal plate 339 has a plurality of leg portions 317 integrally projected therefrom. Further, this frame 339 has a plurality of projection members 340 integrally projected therefrom inwardly. The projection members 340 are fixed to the negative-polarity current collecting member 335 of the film-shaped battery 330 by welding.

A leg portion 338 is formed of a metal plate member bent in an L-letter configuration. This leg portion 338 is fixed to the positive-polarity current collecting member 334 of the film-shaped battery 330 by welding. The insulating plate 337 is attached to the leg portion 338 and the positive-polarity current collecting member 334.

The inventive shield case 316 thus arranged is fixed at tip ends of the leg portions 317 and 338 to the substrate 312 by soldering or the like and also connected to the circuit pattern of the substrate 312 similar to the embodiment mentioned just above.

Further, the inventive shield case 316 has the through-hole 318 passing the film-shaped battery 330 and the insulating plate 337 so that the user can adjust the variable electronic assembly 319 mounted on the substrate 312. The portion of the through-hole 318 is shielded by the annular shielding member 336' similarly to the embodiment of the present invention mentioned just above.

In the above-mentioned embodiments, the film-shaped battery might be a primary cell or a secondary cell. If the film-shaped battery is used as the primary cell, then the film-shaped battery has to be exchanged similarly to the conventional battery. If on the other hand the film-shaped battery is used as the secondary cell, then the film-shaped battery need not be exchanged and becomes more useful in actual practice.

Figure 44:
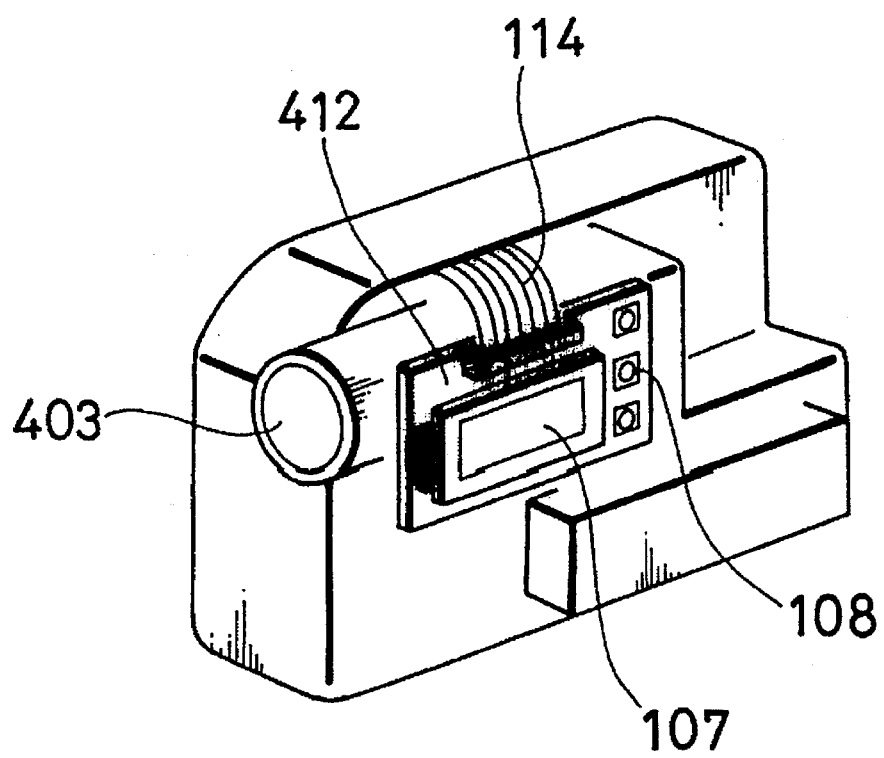
FIG. 44 is a perspective view showing an example of a small video camera with its outer casing being removed.

FIG. 44 is a perspective view showing an example of a small video camera with an outer casing (cabinet) being removed. As shown in FIG. 44, there is provided a subtrate 412 on which a liquid crystal panel 107 and change-over switches 108 are mounted.

Figure 45:
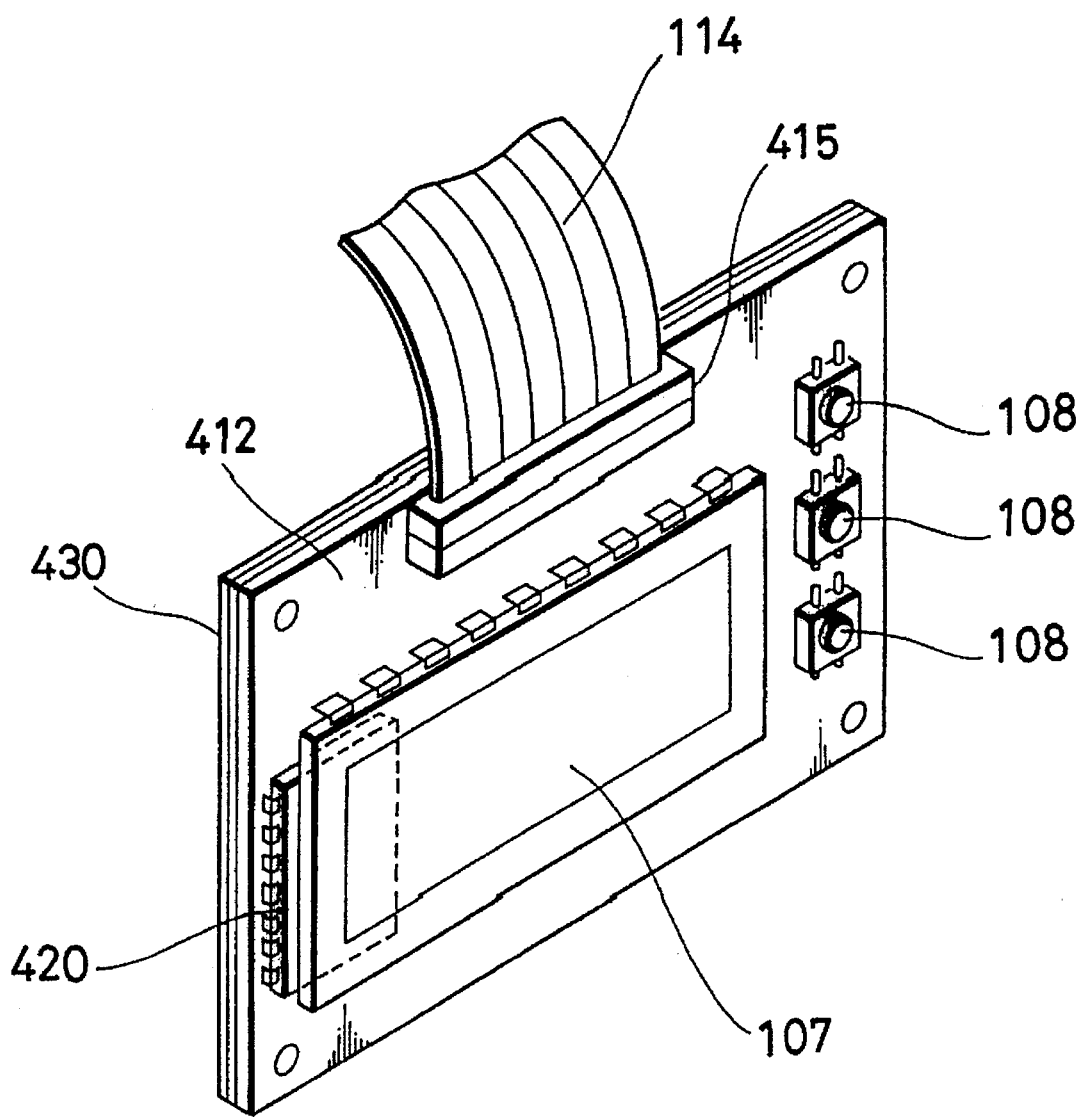
FIG. 45 is a perspective view showing a printed circuit board incorporated in the video camera shown in FIG. 44.

FIG. 45 shows the substrate 412 in an enlarged scale. As shown in FIG. 45, a flexible printed circuit board 414 connects an electronic circuit of the substrate 412 to an electronic circuit of another substrate. A connector 415 is mounted on the substrate 412 to receive the flexible printed circuit board 114. An IC 420 is mounted on the substrate 412.

In this embodiment of invention, a film-shaped battery 430 is used as the power supply for backing up the memory of the IC 420. The film-shaped battery 430 is closely attached to the substrate 412 as one body.

Figure 46:
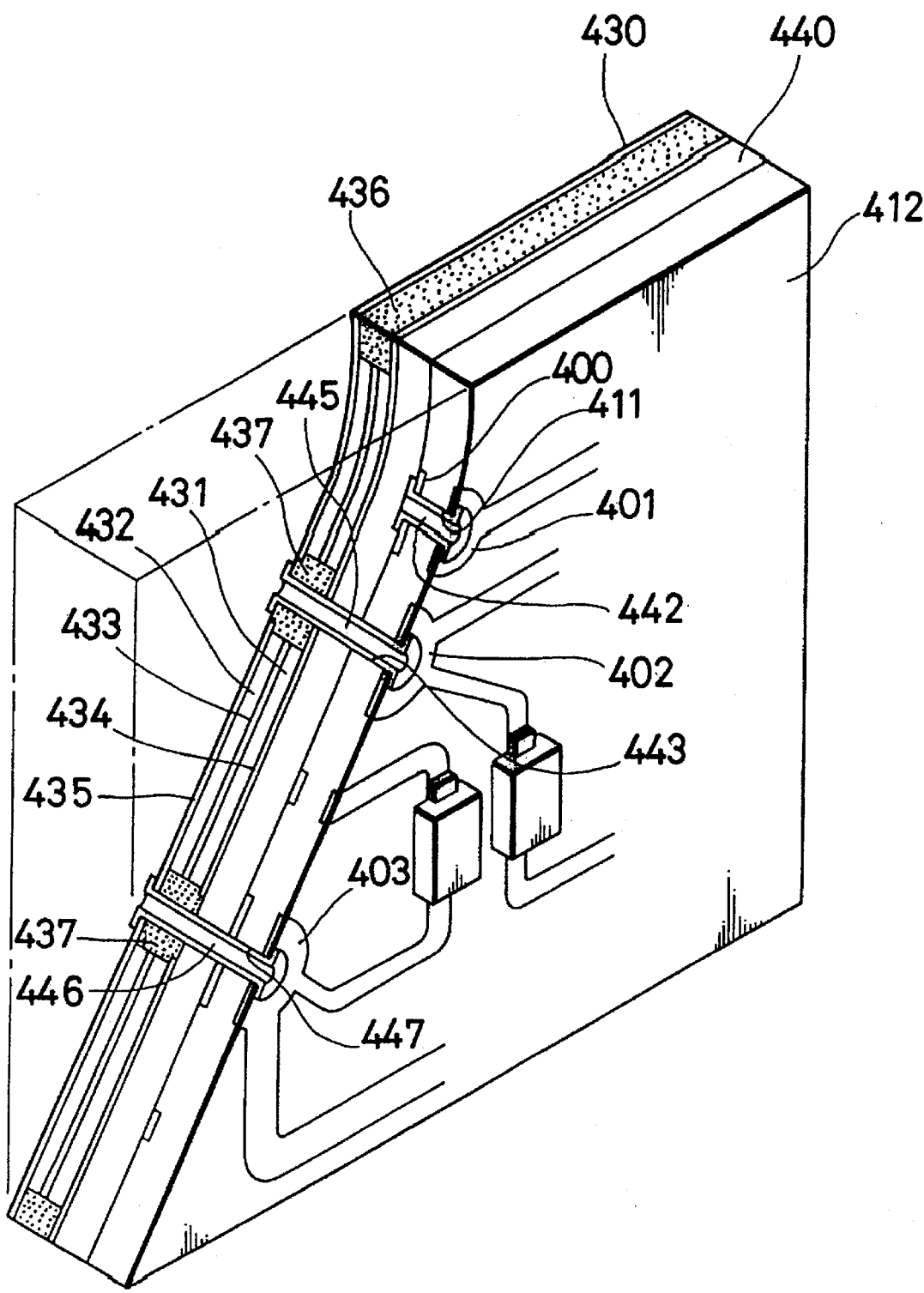
FIG. 46 is a perspective view showing a printed circuit board in which film-shaped batteries are laminated.
Figure 47:
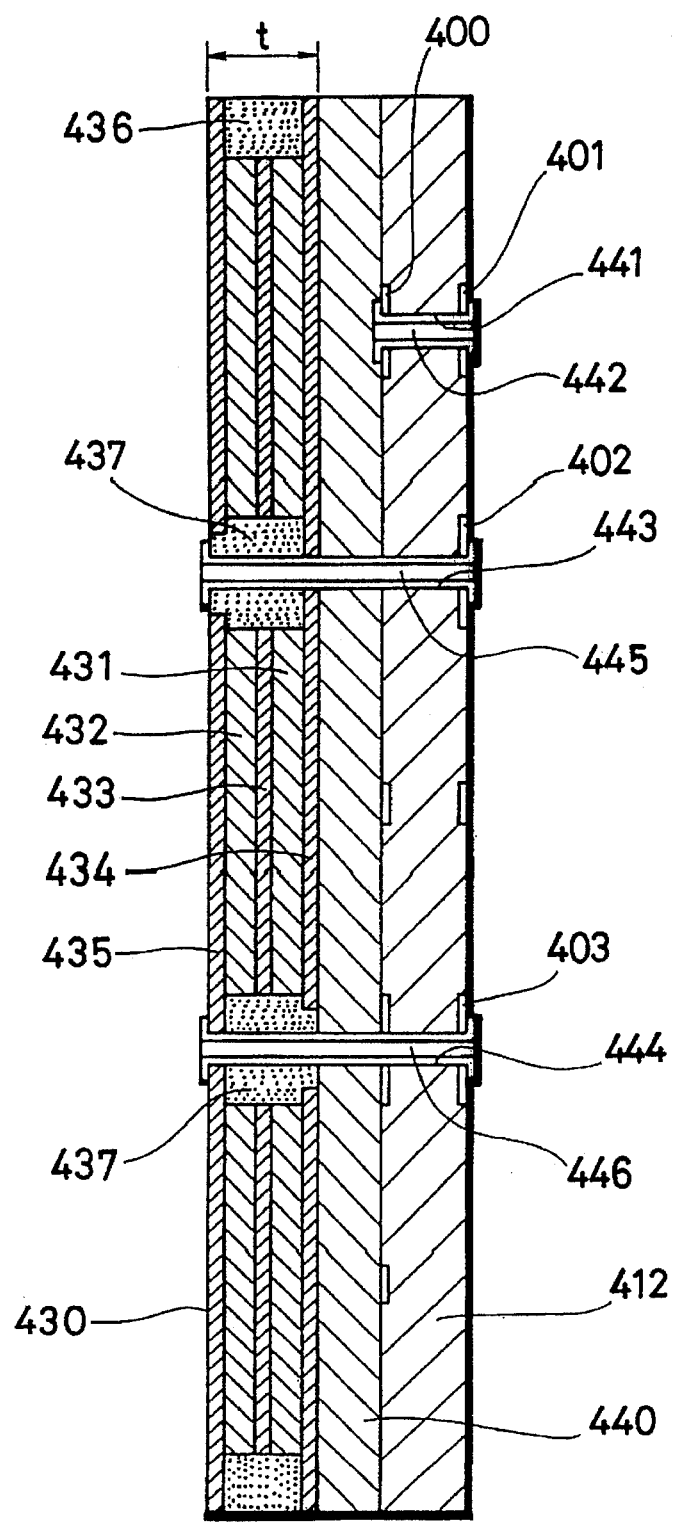
FIG. 47 is a cross-sectional view showing the printed circuit board shown in FIG. 45.
Figure 48:
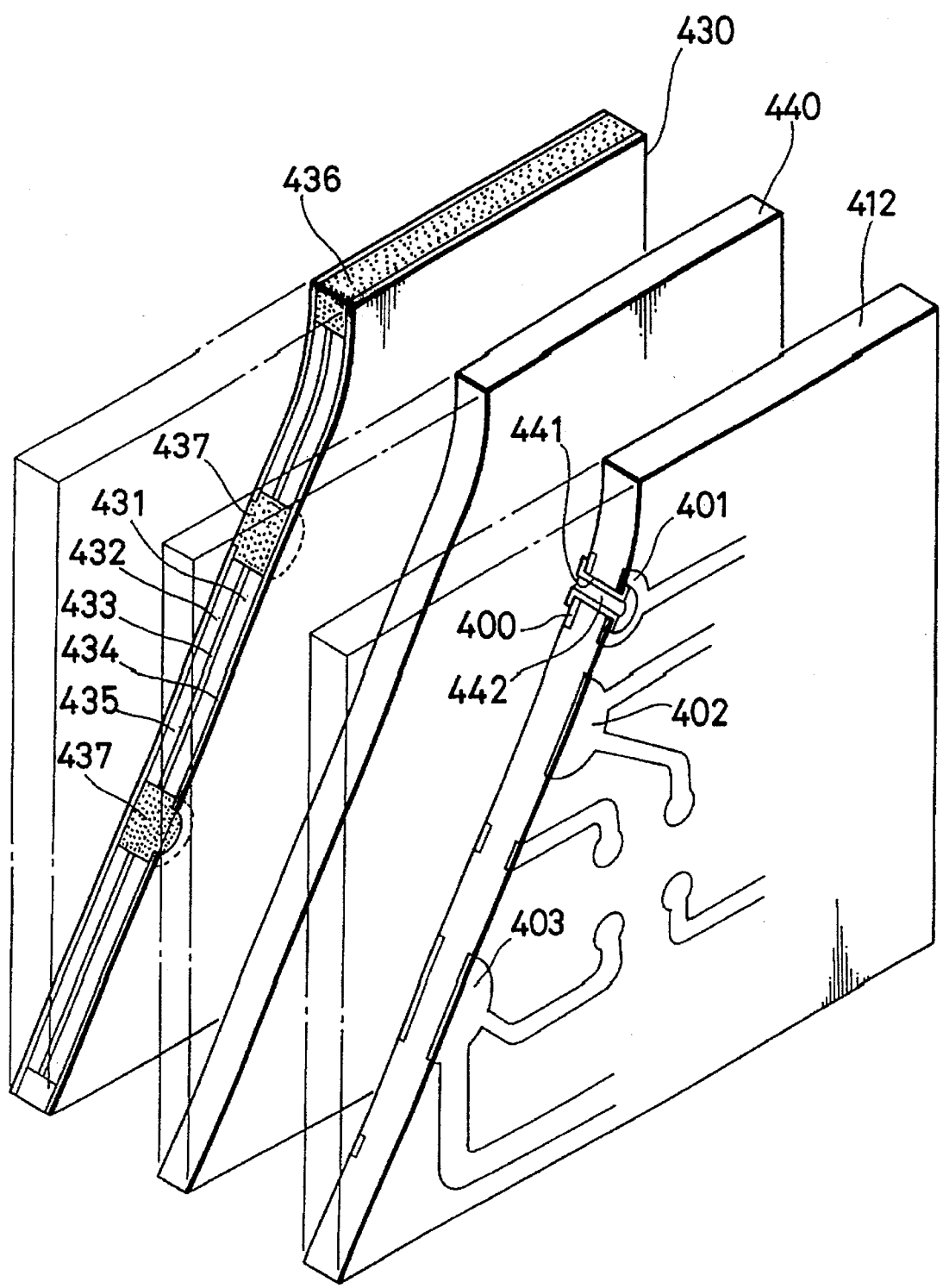
FIGS. 48 and 49 are a perspective views used to explain a manufacturing process of the printed circuit board shown in FIG. 47.
Figure 49:
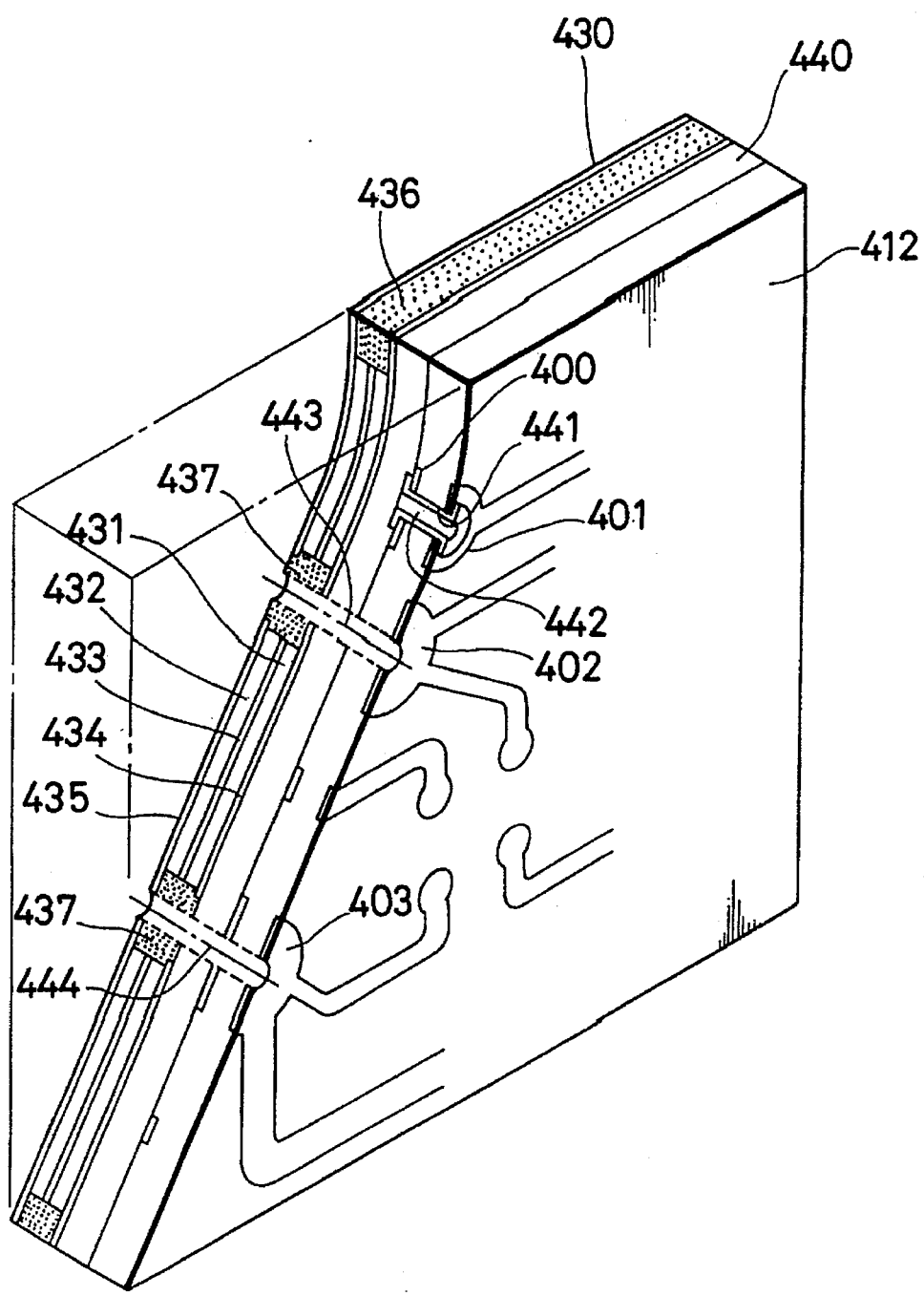

FIGS. 46 to 49 show a further embodiment of the present invention. FIG. 46 is a perspective view showing a substrate 412 on which a film-shaped battery 430 is laminated. FIG. 47 is a cross-sectional view showing the substrate. FIGS. 48 and 49 are diagrams used to explain a manufacturing process of the substrate.

As illustrated, the substrate 412 is a so-called double-sided substrate in which circuit patterns are printed on both surfaces thereof. The film-shaped battery 430 is laminated on the substrate 412 through a glass epoxy plate 440.

The film-shaped battery 430 is a thin high performance battery with a high energy density. The film-shaped battery 430 is fundamentally composed of a positive polarity electrode (manganese dioxide, etc.) 431, a negative polarity electrode (lithium, etc.) 432, a solid polyelectrolyte 433 disposed between the positive polarity electrode 431 and the negative polarity electrode 432, the positive-polarity and negative-polarity current collecting members (serving also as outer sheathing members) 434, 435 each formed of a metal plate (foil) and a shielding member 436 for hermetically shielding the positive-polarity and negative-polarity current collecting members 434, 435.

Although the film-shaped battery 430 is very thin and has the thickness t ranging from about 0.2 mm to 0.5 mm, the film-shaped battery 430 is drawn thick in exaggerated form in order to facilitate the understanding the structure thereof.

In the substrate 412, the double-sided patterns 400 and 401 are conducted via a through-hole 441 plated with a conductor material 442. Similarly, the substrate 412 and the electrodes of the film-shaped battery 430 are conducted via through-holes.

Specifically, through-holes 443, 444 are bored in the substrate 412, a glass epoxy plate 440 and the film-shaped battery 430. The through-holes 443, 444 are plated with conducting materials 445, 446. The conducting material 445 conducts the positive-polarity current collecting member 434 of the film-shaped battery 430 and the pattern 402 of the substrate 412 to apply a positive voltage to the pattern 402. The other conducting material 446 conducts the negative-polarity current collecting member 435 of the film-shaped battery 430 and the pattern 403 of the substrate 412 to hold the pattern 402 at 0 V.

The film-shaped battery 430 is insulated at its portion in which the through-holes 443, 444 are formed by the shielding member 437.

A manufacturing process of the battery laminated substrate will be described with reference to FIGS. 48 and 49.

Initially, as shown in FIG. 48, there are prepared the film-shaped battery 430, the glass epoxy plate 440 and the substrate 412 individually. These three elements 430, 440 and 412 are overlapped by a pressure and laminated. Predetermined patterns are printed on both surfaces of the substrate 412 in advance. Then, the through-hole 441 is bored through the substrate 412 and the printed patterns and plated with the conductor 442 to thereby conduct the patterns 400 and 401 on both surfaces of the substrate 412.

Then, under the condition that the film-shaped battery 430, the glass epoxy plate 440 and the substrate 412 are laminated, as shown in FIG. 49, through-holes 443, 444 are bored by a drill. The through-holes 443, 444 are plated on its inner peripheral surface with a conductor material. If the plating is difficult, then a silver or copper paste may be filled into the through-holes 443, 444 or a cylindrical or rod-shaped conductor may be fitted into the through-holes 443, 444 by caulking.

The film-shaped battery 430 has the positive-polarity current collecting member 434 instead of the negative-polarity current collecting member 435 at its portion in which the through-hole 443 is bored, i.e., the portion through which the conductor 445 is laid to cause the positive-polarity current collecting member 434 to be conducted with the pattern 402 of the substrate 412 through the conductor 445. Furthermore, the film-shaped battery 430 has the negative-polarity current collecting member 435 instead of the positive-polarity current collecting member 434 at its portion in which the through-hole 444 is formed, i.e., the portion through which the conductor 446 is laid to thereby cause the negative-polarity current collecting member 435 to be conducted with the pattern 403 of the substrate 412 through the conductor 446.

Since the film-shaped battery 430 laminated on the substrate 412 is very thin and has the thickness t ranging from about 0.2 mm to 0.5 mm, the film-shaped battery 430 can be easily assembled into a small space of the video camera body without increasing the thickness of the substrate 412 substantially.

The film-shaped battery 430 can be easily and satisfactorily laminated on the substrate 412 by application of a present multilayer printed circuit board technique.

Further, since the film-shaped battery 430 is integrally assembled into the substrate 412 as the memory backup power supply, the arrangement on the substrate 412 can be simplified. More specifically, it is needless to provide on the substrate 412 the contacts to be connected to the battery and also it is of no need to provide the battery holder used in the prior art.

Incidentally, the film-shaped battery 430 might be formed of a primary cell or a secondary cell. Since the film-shaped battery 430 is assembled into the substrate 412, if the film-shaped battery 430 is formed as the secondary cell, then there can be brought about best results.

Figure 50:
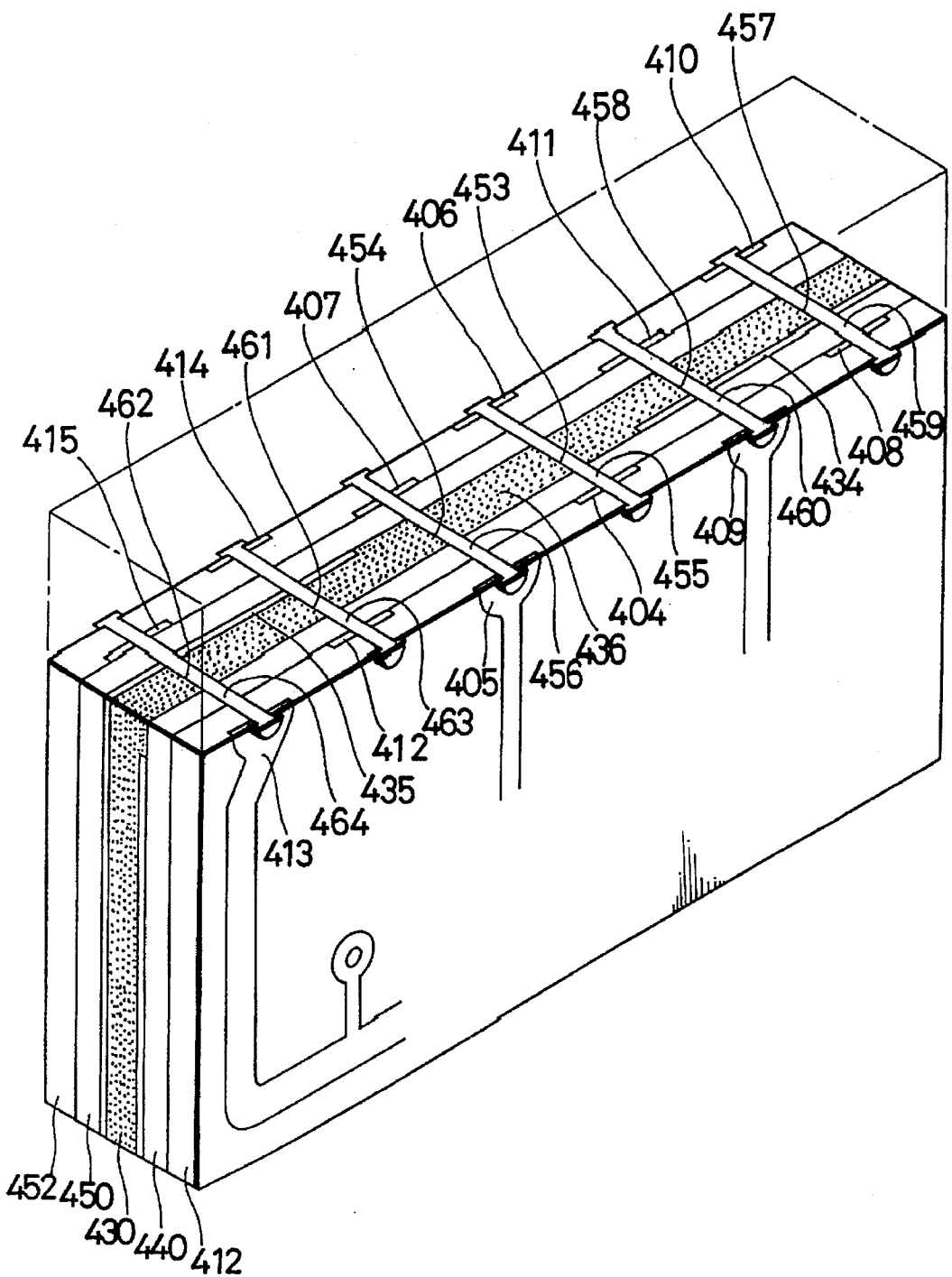
FIG. 50 is a perspective view of a further embodiment of the present invention and illustrating a multilayer printed circuit board in which film-shaped batteries are laminated.
Figure 52:
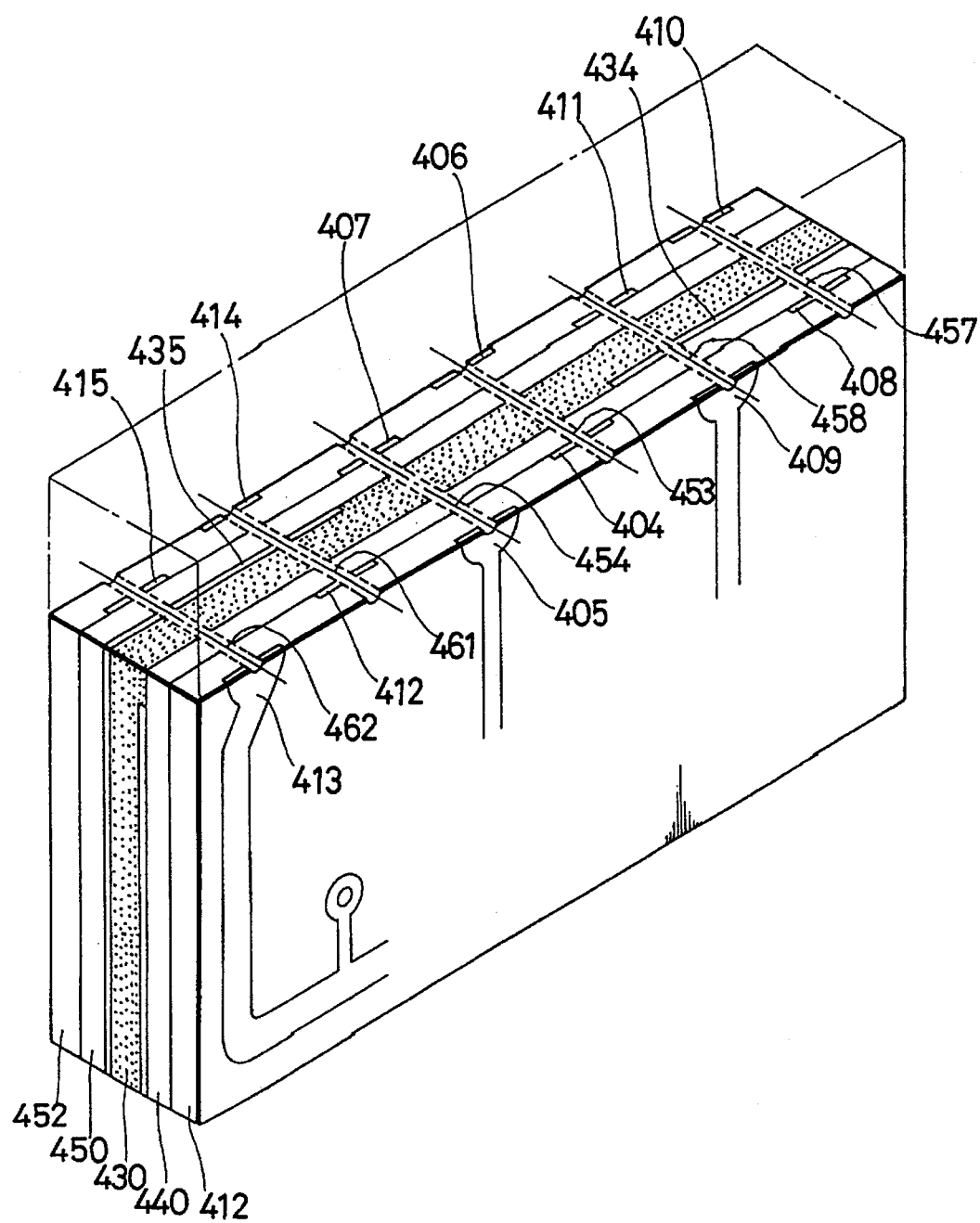

FIGS. 50, 51 and 52 show a further embodiment of the present invention in which the number of substrates to be laminated is increased much more.

FIG. 50 is a perspective view of substrates on which the film-shaped battery is laminated. FIGS. 51 and 52 are perspective views used to explain a manufacturing process of the substrates.

The inventive embodiment includes another similar substrate 452 in addition to the substrate 412. The film-shaped battery 430 is sandwiched between the two substrates 412 and 452 through glass epoxy plates 440, 450.

Patterns 404, 405 of the substrate 412 and patterns 406, 407 of the substrate 452 are conducted by conductors 455, 456 inserted into the through-holes 453, 454.

The positive-polarity current collecting member 434 of the film-shaped battery 430 and patterns 408, 409 of the substrate 412 and the patterns 410, 411 of the substrate 452 are conducted by conductors 450, 460. Thus, a positive voltage is applied to the patterns 408, 409 and 410, 411.

The negative-polarity current collecting member 435 of the film-shaped battery 430 and patterns 412, 413 of the substrate 412 and patterns 414, 415 of the substrate 452 are conducted by conductors 463, 464 inserted into through-holes 461, 462. Thus, the patterns 412, 413, 414 and 415 are held at 0 V.

A manufacturing process of this multilayer laminated substrate will be described. Initially, as shown in FIG. 51, there are prepared the substrates 412, 452, the epoxy glass plates 440, 450 and the film-shaped battery 430. Then, the substrates 412, 452, the epoxy glass plates 440, 450 and the film-shaped battery 430 are laminated with a pressure.

Under the condition that the substrates 412, 452, the epoxy glass plates 440, 450 and the film-shaped battery 430 are laminated, as shown in FIG. 52 through-holes 453, 454, 457, 458, 461, 462 are bored through the substrates 412, 452, the epoxy glass plates 440, 450 and the film-shaped battery 430 by a drill. Then, conductors 455, 456, 459, 460, 463, 464 such as silver paste are filled into the through-holes 453, 454, 457, 458, 461, 462, respectively.

The film-shaped battery 430 includes neither the positive-polarity current collecting member 434 nor the negative-polarity current collecting member 435 formed at its portion where the through-holes 453, 454 are formed, i.e., at its portion where the conductors 455, 456 are laid. Therefore, the patterns 404, 405 of the substrate 412 and the patterns 406, 407 of the substrate 452 are conducted through the conductors 455, 456 regardless of the film-shaped battery 430.

The film-shaped battery 430 includes the positive-polarity current collecting member 434 instead of the negative-polarity current collecting member 434 formed at its portion where the through-holes 457, 458 are formed, i.e., at its portion where the conductors 459, 460 are laid. Therefore, the positive-polarity current collecting member 434 is conducted to the patterns 408, 409 of the substrate 412 and the patterns 410, 411 of the substrate 452 through the conductors 459, 460.

Furthermore, the film-shaped battery 430 includes the negative-polarity current collecting member 435 instead of the positive-polarity current collecting member 434 formed at its portion where the through-holes 461, 462 are formed, i.e., at its portion where the conductors 463, 464 are laid. Therefore, the negative-polarity current collecting member 435 is conducted to the patterns 412, 413 of the substrate 412 and the patterns 414, 415 of the substrate 452 through the conductors 463, 464.

As described above, according to the present invention, the film-shaped battery can be attached to the electronic device with ease by bonding. When the film-shaped battery is detached from the electronic device, the film-shaped battery can be detached from the electronic device with ease. Therefore, the user can exchange the battery very easily.

Since the film-shaped battery is attached to the electronic device by bonding, the battery lid or the like becomes unnecessary unlike the conventional battery. Therefore, unlike the conventional battery which often becomes useless when the battery lid is broken or lost, the inventive film-shaped battery can be prevented from becoming useless. Thus, the inventive film-shaped battery becomes more reliable.

Since the inventive film-shaped battery is extremely thin, even when this film-shaped battery is attached to the electronic device by bonding, the thickness of the electronic device is substantially never increased. Accordingly, this film-shaped battery is applied to the thin electronic device with large effects being achieved. Moreover, if the film-shaped battery is applied to the thin electronic device, then the thin electronic device can be made thinner.

Since the film-shape battery has the adhesive surface fully surrounding the electrodes, when the film-shaped battery is bonded to the electronic device, it is possible to prevent the film-shaped battery from being smudged by water and dust.

Since the electrodes of the film-shaped battery and the terminals of the electronic device are connected together under the condition that they are urged against one another when the film-shaped battery is attached to the electronic device, a stable conducting state can be maintained and the film-shaped battery becomes more reliable.

According to the present invention, since the film-shaped battery is used as the battery housed in the electronic device and the film-shaped battery is closely formed with the printed circuit board as one body, the battery can be assembled into the narrow space of the electronic device with an improved space factor. Moreover, unlike the conventional battery, the battery holder and the battery contacts or the like can be removed. Thus, the number of assemblies can be reduced and the battery becomes inexpensive.

Having described preferred embodiments of the invention with reference to the accompanying drawings, it is to be understood that the invention is not limited to those precise embodiments and that various changes and modifications could be effected therein by one skilled in the art without departing from the spirit or scope of the novel concepts of the present invention as defined in the appended claims.

What is claimed is:

1. An electronic device having a film-shaped battery connected thereto by adhesive bonding or soldering, wherein said battery and said electronic device are connected electrically, and wherein said battery has on its flat surface provided an electrode extending in the direction substantially perpendicular to said flat surface and said battery is fixed to said electronic device by soldering said electrode to a printed circuit board.

2. An electronic device having a film-shaped battery connected thereto by adhesive bonding or soldering, wherein said battery and said electronic device are connected electrically, and wherein said battery has an adhesive layer provided on its flat surface and said battery is fixed to said electronic equipment by said adhesive layer.

3. An electronic device having a film-shaped battery connected thereto by adhesive bonding or soldering, wherein said battery and said electronic device are connected electrically, and wherein said battery has an adhesive layer provided on its flat surface and said battery is fixed to a printed circuit board used in said electronic device by said adhesive layer.

4. An electronic device having a film-shaped battery connected thereto by adhesive bonding or soldering, wherein said battery and said electronic device are connected electrically, and wherein said battery has a thickness ranging from about 0.2 mm to 0.5 mm.

5. An electronic device having a film-shaped battery connected thereto by adhesive bonding or soldering, wherein said battery and said electronic device are connected electrically, and wherein said battery has a through-hole.

6. An electronic device according to claim 3, wherein said printed circuit board and an electrode of said battery are conducted by conductors provided through a through-hole.

7. An electronic device according to claim 3, wherein said battery is bonded to said printed circuit board and an electrode of said battery is connected to a circuit pattern of said printed circuit board by soldering to apply an electric power to the circuit pattern of said printed circuit board.

8. An electronic device according to claim 6, wherein said battery has a first portion formed of only a positive-polarity electrode and a second portion formed of only a negative-polarity electrode, wherein said battery and said printed circuit board are conducted by inserting conductors into said through-holes which are formed through said first and second portions.

9. A battery bonded to an electronic device comprising:
   a film-shaped battery;
   an electrode formed on one surface of said film-shaped battery; and
   an adhesive layer formed on one surface of said film-shaped battery, wherein said battery is electrically connected to said electronic device by connecting said electrode to a terminal of said electronic device under the condition that said film-shaped battery is bonded to said electronic device by said adhesive layer.

10. A battery bonded to an electronic device according to claim 9, wherein said adhesive layer has a structure such that said adhesive layer surrounds said electrodes continuously.

11. A battery bonded to an electronic device according to claims 9 or 10, further comprising means for urging said electrode of said film-shaped battery and said terminal of said electronic device against one another when said film-shaped battery is attached to a predetermined position of said electronic device.

12. An electronic device having a film-shaped battery connected thereto by adhesive bonding or soldering, wherein said battery and said electronic device are connected electrically, and wherein said battery comprises:
- a positive polarity electrode portion;
- a negative polarity electrode portion;
- a solid polyelectrolyte disposed between the positive and negative electrode portions;
- a positive polarity current collecting member located on a face surface of the positive electrode;
- a negative polarity current collecting member located on a face surface of the negative electrode; and
- a shielding member for hermetically shielding the positive polarity and negative polarity current collecting members.

13. A battery as in claim 12, wherein each of said current collecting members is made of a metal plate.

14. An electronic device as in claim 12, wherein said battery further comprises a hollow central portion which retains the positive polarity current collecting member and wherein part of said positive polarity current collecting member is projected in a cone shape and exposed to serve as a positive polarity electrode portion.

15. An electronic device as in claim 12, wherein said battery is encircled by an insulating outer sheathing member containing a hole for exposing portion of the negative polarity current collecting member wherein said exposed portion serves as a negative polarity electrode portion.

16. An electronic device having a film-shaped battery connected thereto by adhesive bonding or soldering, wherein said battery and said electronic device are connected electrically, and wherein said electronic device further comprises a battery detachable lever for facilitating detachment of the battery from the electronic device.

17. An electronic device as in claim 15, wherein said battery further comprises:
- an extension of positive polarity current collecting member to the central portion at which it is exposed to the hole;
- a tip end portion of said extension being the positive electrode portion;
- an insulating plate interposed between the extension and the negative polarity current collecting member.

18. An electronic device as in claim 17, wherein said extended pattern is set at a 45° angle from the direction in which power supply terminals of said electronic device are disposed.

19. An electronic device as in claim 12, wherein said battery further comprises:
- a first resilient plate portion formed from an elongated part of the positive polarity current collecting member;
- a second resilient plate portion formed from an elongated part of the negative polarity current collecting member;
- wherein each of said resilient plate portions comprise respective tip end portions which serve as positive and negative electrodes.

20. An electronic device as in claim 3, wherein the film-shaped battery is flexible so that it can be flexed-together with the flexible printed circuit board.

21. An electronic device according to claim 3, wherein said battery comprises:
- a positive electrode;
- a negative electrode;
- a solid polyelectrolyte disposed between the positive and negative electrodes;
- a positive polarity current collecting member located on a face surface of the positive electrode;
- a negative polarity current collecting member located on a face surface of the negative electrode; and
- a shielding member for hermetically shielding the positive polarity and negative polarity current collecting members.

22. An electronic device as in claim 21, further comprising:
- a first through hole formed through the battery and fitted with a first conductor for connecting the positive polarity current collecting member with a first circuit pattern of the printed circuit board.
- a second through hole formed through the battery and fitted with a second conductor for connecting the negative polarity current collecting member with a second circuit pattern of the printed circuit board.

23. An electronic device as in claim 21, wherein said battery is assembled as part of a shield case attached to the inside of a substrate of said printed circuit board, wherein said shield case further comprises:
- a plurality of first leg portions integrally extended from the negative polarity current collecting member of the battery for connecting said shield case to said substrate; and
- a plurality of second leg portions integrally extended from the positive polarity current collecting member of the battery for connecting said shield case to said substrate.

24. An electronic device as in claim 23, wherein said shield case further comprises a through hole formed through the film shaped battery for allowing adjustment of a variable electronic assembly mounted on said substrate.

25. An electronic device as in claim 23, wherein said battery is used as the power supply for backing up the memory of the electronic device.

26. An electronic device as in claim 23, wherein said substrate has circuit patterns printed on two side surfaces of the substrate.

27. A film-shaped battery laminated substrate combination comprising:
- at least one substrate with predetermined circuit patterns printed on first and second surfaces of said substrate;
- at least one epoxy glass plate;
- a film shaped battery;
- a first through-hole bored through said substrate, the epoxy glass plate and the battery;
- a first conductor inserted within said first through hole for connecting a positive polarity current collecting member of said battery with predetermined patterns of said substrate;
- a second through-hole bored through said substrate, the epoxy glass plate and the battery;
- a second conductor inserted within said second through hole for connecting a negative polarity current collecting member of said battery with predetermined patterns of said substrate.

28. An electronic device according to claim 2, wherein said battery comprises:
- a positive electrode;
- a negative electrode;
- a solid polyelectrolyte disposed between the positive and negative electrodes;
- a positive polarity current collecting member located on a face surface of the positive electrode;
- a negative polarity current collecting member located on a face surface of the negative electrode; and a shielding member for hermetically shielding the positive polarity and negative polarity current collecting members.

29. An electronic device having a film-shaped battery connected thereto by adhesive bonding or soldering, wherein said battery and said electronic device are connected electrically;

said battery acts as a shield to minimize the emanation of radiation from said electronic device; and said battery has a through-hole.

30. An electronic device having a film-shaped battery connected thereto by adhesive bonding or soldering, wherein said battery and said electronic device are connected electrically;

said battery acts as a shield to minimize the emanation of radiation from said electronic device;

said battery comprises a metal plate which acts as a shield to minimize the emanation of radiation from said electronic device; and said battery has a through-hole.

31. An electronic device having a film-shaped battery connected thereto by adhesive bonding or soldering, wherein said battery and said electronic device are connected electrically;

said battery has on its flat surface provided an electrode extending in the direction substantially perpendicular to said flat surface;

said battery is fixed to said electronic device by soldering said electrode to a printed circuit board; and said battery has a through-hole.

* * * * *